United States Patent
Koike et al.

(10) Patent No.: US 11,309,483 B2
(45) Date of Patent: Apr. 19, 2022

(54) PIEZOELECTRIC ELEMENT AND LIQUID EJECTING HEAD

(71) Applicant: Seiko Epson Corporation, Tokyo (JP)

(72) Inventors: Harunobu Koike, Matsumoto (JP); Koichi Morozumi, Shiojiri (JP)

(73) Assignee: Seiko Epson Corporation

( * ) Notice: Subject to any disclaimer, the term of this patent is extended or adjusted under 35 U.S.C. 154(b) by 650 days.

(21) Appl. No.: 16/285,664

(22) Filed: Feb. 26, 2019

(65) Prior Publication Data

US 2019/0267537 A1 Aug. 29, 2019

(30) Foreign Application Priority Data

Feb. 27, 2018 (JP) ............................ JP2018-033328

(51) Int. Cl.

| | |
|---|---|
| *H01L 41/187* | (2006.01) |
| *B41J 2/14* | (2006.01) |
| *C04B 35/495* | (2006.01) |
| *H01L 41/047* | (2006.01) |
| *H01L 41/09* | (2006.01) |
| *H01L 41/39* | (2013.01) |
| *H01L 41/318* | (2013.01) |
| *H01L 41/08* | (2006.01) |

(52) U.S. Cl.
CPC ...... *H01L 41/1873* (2013.01); *B41J 2/14233* (2013.01); *C04B 35/495* (2013.01); *H01L 41/047* (2013.01); *H01L 41/0805* (2013.01); *H01L 41/0973* (2013.01); *H01L 41/318* (2013.01); *H01L 41/39* (2013.01); *B41J 2002/14241* (2013.01); *B41J 2002/14419* (2013.01); *B41J 2202/03* (2013.01); *C04B 2235/3201* (2013.01)

(58) Field of Classification Search
CPC ............... H01L 41/1873; H01L 41/047; H01L 41/0805; H01L 41/0973; H01L 41/39; C04B 35/495; B41J 2/14233; B41J 2202/03

See application file for complete search history.

(56) References Cited

U.S. PATENT DOCUMENTS

| | | | |
|---|---|---|---|
| 6,884,364 B2* | 4/2005 | Sato | ...................... C04B 35/495 252/62.9 R |
| 8,674,589 B2* | 3/2014 | Hatano | ................. C04B 35/495 310/358 |
| 2006/0006360 A1 | 1/2006 | Takao et al. | |
| 2013/0162109 A1 | 6/2013 | Hatano et al. | |
| 2015/0015123 A1 | 1/2015 | Koizumi et al. | |
| 2017/0229637 A1 | 8/2017 | Sakai et al. | |

FOREIGN PATENT DOCUMENTS

| | | |
|---|---|---|
| JP | H11-170547 A | 6/1999 |
| JP | 2006-028001 A | 2/2006 |
| JP | 2013-014470 A | 1/2013 |
| WO | WO-2013-146975 A1 | 10/2013 |

OTHER PUBLICATIONS

Extended European Search Report for Application No. EP 19 15 8994 dated Jul. 17, 2019 (6 pages).

A. Kupec et al., "Microstructure-Dependent Leakage-Current Properties of Solution-Derived $(K_{0.5}Na_{0.5})NbO_3$ Thin Films", Journal of the European Ceramic Society, vol. 35, No. 13, May 31, 2015, pp. 3507-3511.

J. Fang et al., "Narrow Sintering Temperature Window for (K, Na)NbO$_3$-Based Lead-Free Piezoceramics Caused By Compositional Segregation", Physica Status Solidi A, vol. 208, No. 4, Jan. 12, 2011, pp. 791-794.

* cited by examiner

*Primary Examiner* — C Melissa Koslow

(74) *Attorney, Agent, or Firm* — Harness, Dickey & Pierce, P.L.C.

(57) ABSTRACT

Provided is a piezoelectric element including a first electrode provided above a substrate, a piezoelectric layer including a plurality of crystal grains containing potassium, sodium, and niobium and provided above the first electrode, and a second electrode provided above the piezoelectric layer. An atom concentration $N_{K1}$ (atm %) of potassium contained in grain boundaries of the crystal grains and an atom concentration $N_{K2}$ (atm %) of potassium contained in the crystal grains satisfy a relationship of $1.0 < N_{K1}/N_{K2} \leq 2.4$.

18 Claims, 19 Drawing Sheets

FIG. 8

|  | A/B | FA TREATMENT TEMPERATURE (°C) | RTA TREATMENT TEMPERATURE (°C) | Pm ($\mu C/cm^2$) |
|---|---|---|---|---|
| EXAMPLE 1 | 1.07 | 700 | 750 | 25.6 |
| EXAMPLE 2 | 1.07 | 700 | 650 | 24.5 |
| EXAMPLE 3 | 1.07 | 600 | 750 | 25.9 |
| EXAMPLE 4 | 1.07 | 600 | 650 | 24.7 |
| COMPARATIVE EXAMPLE 1 | 1.07 | 700 | - | 18.1 |
| COMPARATIVE EXAMPLE 2 | 1.07 | 600 | - | 17.2 |

FIG. 9

|  | A/B | FA TREATMENT TEMPERATURE (°C) | RTA TREATMENT TEMPERATURE (°C) | Pm ($\mu C/cm^2$) |
|---|---|---|---|---|
| COMPARATIVE EXAMPLE 3 | 1.00 | 700 | - | 19.0 |
| COMPARATIVE EXAMPLE 4 | 1.04 | 700 | - | 19.8 |
| COMPARATIVE EXAMPLE 5 | 1.10 | 700 | - | 22.8 |

PIEZOELECTRIC ELEMENT AND LIQUID EJECTING HEAD

This application claims priority under 35 U.S.C. § 119 to Japanese Patent Application No. 2018-033328 filed on Feb. 27, 2018, the entire disclosure of which is expressly incorporated by reference herein.

BACKGROUND

1. Technical Field

The present invention relates to a piezoelectric element and a liquid ejecting head.

2. Related Art

A piezoelectric element typically includes a piezoelectric layer having an electromechanical conversion characteristic and two electrodes that sandwich the piezoelectric layer. Such a piezoelectric element is incorporated in, for example, a liquid ejecting head represented by an ink jet recording head.

For example, JP-A-11-170547 discloses reducing a heat treatment temperature by adding a sintering auxiliary containing PbO, $SiO_2$, and the like as components forming a liquid phase during heat treatment of PZT ceramics, then causing sintering, and thus causing the content of Pb, Si, and the like in a composition of grain boundaries to be higher than in grains after heat treatment. As a result of this, scattering of Pd in PZT ceramics can be suppressed.

In addition, development of non-lead-based piezoelectric materials in which the content of Pd is reduced from the viewpoint of reducing ecological load has been promoted. Potassium sodium niobate ((K,N)NbO₃: KNN) is known as one of the non-lead-based piezoelectric materials.

JP-A-11-170547 discloses a composition of grain boundaries in a PZT piezoelectric material, but does not disclose a composition of grain boundaries in a KNN piezoelectric material. The present inventors have carried out intensive studies, and found that there is a correlation between piezoelectric characteristics and a ratio between an atom concentration of potassium in grain boundaries and an atom concentration of potassium in crystal grains in a KNN piezoelectric material.

SUMMARY

A piezoelectric element according to an aspect of the invention includes a first electrode provided above a substrate, a piezoelectric layer including a plurality of crystal grains containing potassium, sodium, and niobium and provided above the first electrode, and a second electrode provided above the piezoelectric layer. An atom concentration $N_{K1}$ (atm %) of potassium contained in grain boundaries of the crystal grains and an atom concentration $N_{K2}$ (atm %) of potassium contained in the crystal grains satisfy a relationship of $1.0 < N_{K1}/N_{K2} \leq 2.4$.

In the aspect described above, an atom concentration $N_{Na1}$ (atm %) of sodium contained in the grain boundaries may be lower than an atom concentration $N_{Na2}$ (atm %) of sodium contained in the crystal grains.

In the aspect described above, the atom concentration $N_{Na1}$ and the atom concentration $N_{Na2}$ may satisfy a relationship of $0.55 \leq N_{Na1}/N_{Na2} \leq 0.75$.

In the aspect described above, the atom concentration $N_{K1}$ and the atom concentration $N_{K2}$ may satisfy a relationship of $1.5 \leq N_{K1}/N_{K2} \leq 2.0$.

In the aspect described above, the piezoelectric layer may include a plurality of layers containing the crystal grains laminated in a film thickness direction, and an atom concentration $N_{K3}$ (atm %) of potassium on the second electrode side of each of the layers containing the crystal grains may be higher than an atom concentration $N_{K4}$ (atm %) of potassium on the first electrode side of each of the layers containing the crystal grains.

In the aspect described above, the atom concentration $N_{K3}$ and the atom concentration $N_{K4}$ may satisfy a relationship of $2.0 \leq N_{K3}/N_{K4} \leq 4.0$.

In the aspect described above, an atom concentration (atm %) of sodium contained on the second electrode side of each of the layers containing the crystal grains may be lower than an atom concentration (atm %) of sodium contained on the first electrode side of each of the layers containing the crystal grains.

In the aspect described above, an atom concentration (atm %) of potassium at centers of the grain boundaries may be higher than an atom concentration (atm %) of potassium in a region in a distance equal to or longer than 70 nm from the centers of the grain boundaries.

In the aspect described above, an atom concentration (atm %) of sodium at centers of the grain boundaries may be lower than an atom concentration (atm %) of sodium in a region in a distance equal to or longer than 70 nm from the centers of the grain boundaries.

A liquid ejecting head according to an aspect of the invention includes the piezoelectric element according to the invention.

BRIEF DESCRIPTION OF THE DRAWINGS

The invention will be described with reference to the accompanying drawings, wherein like numbers reference like elements.

FIG. 8 is a table showing saturation polarization values of Examples 1 to 4 and Comparative Examples 1 and 2.

FIG. 9 is a table showing saturation polarization values of Comparative Examples 3 to 5.

DESCRIPTION OF EXEMPLARY EMBODIMENTS

A preferable embodiment of the invention will be described in detail with reference to drawings. To be noted, the embodiment that will be described later should not unreasonably limit the scope of the invention described in claims. In addition, not all elements that will be described below are always required for the invention.

1. PIEZOELECTRIC ELEMENT

Figure 1:
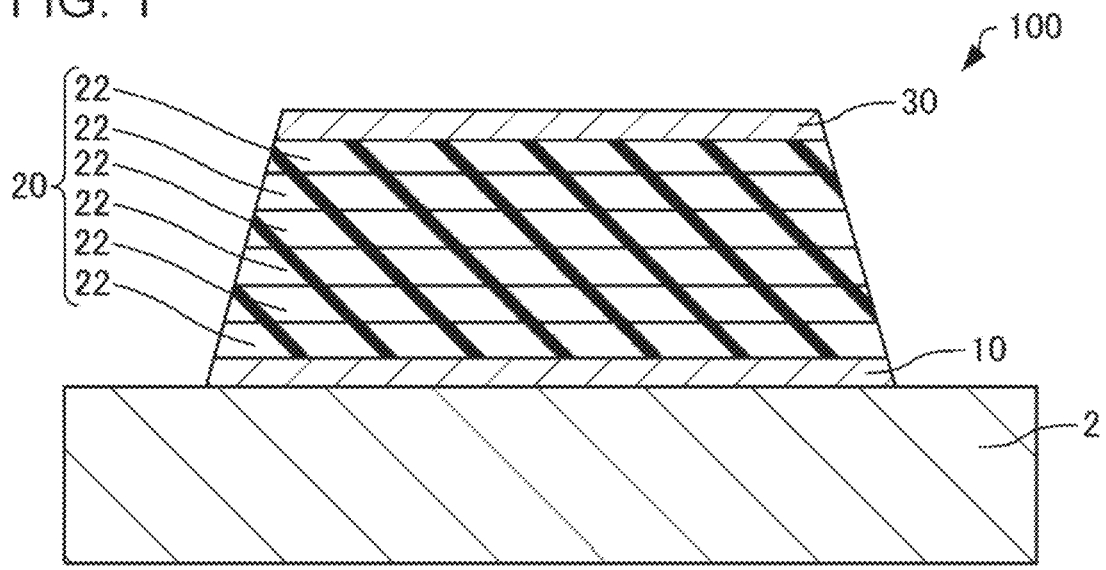
FIG. 1 is a schematic section view of a piezoelectric element according to an embodiment.

First, a piezoelectric element according to the present embodiment will be described with reference to drawings. FIG. 1 is a schematic section view of a piezoelectric element 100 according to the present embodiment.

As illustrated in FIG. 1, the piezoelectric element 100 includes a first electrode 10, a piezoelectric layer 20, and a second electrode 30. The piezoelectric element 100 is provided above the substrate 2. In the illustrated example, the piezoelectric element 100 is provided on the substrate 2.

To be noted, in description related to the invention, a term "above" is used in such a manner that, for example, "forming a specific thing (hereinafter referred to as "B") "above" another specific thing (hereinafter referred to as "A")" refers to both of a case where B is formed directly on A and a case where B is formed above A with another matter interposed therebetween.

For example, the substrate 2 is a flat plate formed from semiconductor, insulator, or the like. The substrate 2 may be a single layer or have a structure in which a plurality of layers are laminated. The inner structure of the substrate 2 is not limited as long as the top surface thereof is flat. For example, the substrate 2 may have a structure in which a space or the like is provided therein.

The substrate 2 may include a diaphragm that is flexible and can be deformed (displaced) by a function of the piezoelectric layer 20. The diaphragm is, for example, a silicon oxide layer, a zirconium oxide layer, a silicon nitride layer, or a laminate of these (for example, a laminate in which a zirconium oxide layer is provided on a silicon oxide layer).

The first electrode 10 is provided above the substrate 2. In the illustrated example, the first electrode 10 is provided on the substrate 2. The shape of the first electrode 10 is, for example, a layer shape. The thickness (film thickness) of the first electrode 10 is, for example, 3 nm to 200 nm. Examples of the first electrode 10 include metal layers such as a platinum layer or an iridium layer and, layers of conductive oxides of these, and a strontium ruthenate ($SrRuO_3$: SRO) layer. The first electrode 10 may have a structure in which a plurality of the layers exemplified above are laminated.

The first electrode 10 is one of two electrodes for applying a voltage to the piezoelectric layer 20. The first electrode 10 is a lower electrode provided below the piezoelectric layer 20.

Although not illustrated, a firm contact layer for improving the firmness of contact of the first electrode 10 and the substrate 2 may be provided between the first electrode 10 and the substrate 2. Examples of the firm contact layer include a titanium layer and a titanium oxide layer.

The piezoelectric layer 20 is provided above the first electrode 10. In the illustrated example, the piezoelectric layer 20 is provided on the first electrode 10. The piezoelectric layer 20 is, for example, sandwiched between the first electrode 10 and the second electrode 30. The thickness of the piezoelectric layer 20 is, for example, 100 nm to 3 μm. The piezoelectric layer 20 can be deformed by applying voltage between the first electrode 10 and the second electrode 30.

The piezoelectric layer 20 contains potassium (K), sodium (Na), and niobium (Nb), and has a perovskite structure. The piezoelectric layer 20 is, for example, a potassium sodium niobate (KNN) layer. The piezoelectric layer 20 may be a KNN layer to which manganese (Mn) or calcium (Ca) is added. In the case where the material of the piezoelectric layer 20 is, for example, a composite oxide represented by $(K, Na)_A(Nb, Mn)_BO_3$, the ratio between A and B (A/B) is 1 to 1.1, and is preferably 1.06 to 1.08.

Figure 2:
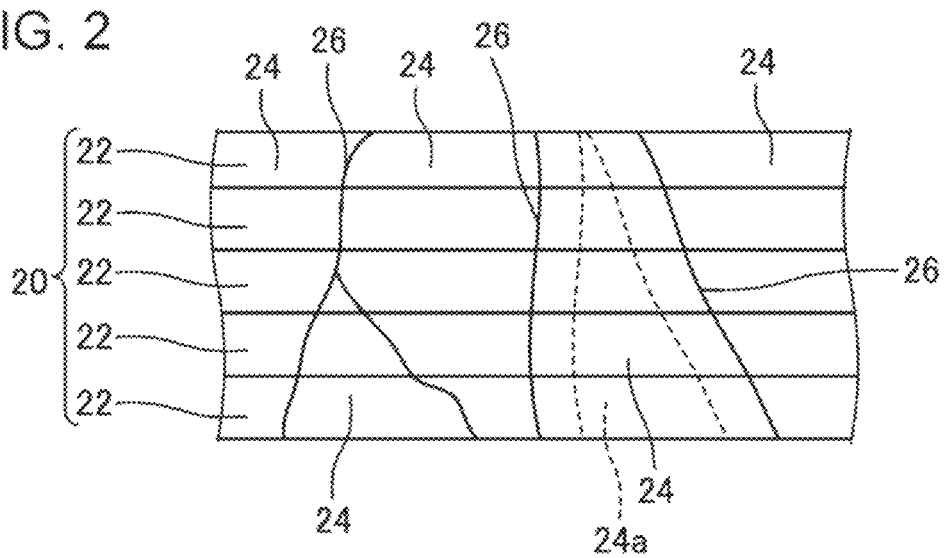
FIG. 2 is a schematic section view of a piezoelectric layer of the piezoelectric element according to the embodiment.

The piezoelectric layer 20 includes, for example, a crystal grain-containing layer 22 containing a crystal grain 24. The crystal grain-containing layer 22 contains a plurality of crystal grains 24. The piezoelectric layer 20 includes a plurality of crystal grain-containing layers 22. The plurality of crystal grain-containing layers 22 are laminated in a film thickness direction of the piezoelectric layer 20. Although the number of the crystal grain-containing layers 22 is six in the illustrated example, the number is not particularly limited as long as a plurality of crystal grain-containing layers 22 are provided. Here, FIG. 2 is a section view for describing the crystal grains 24.

The piezoelectric layer 20 includes a plurality of crystal grains 24. The crystal grains 24 contain potassium, sodium, and niobium. The shape of the crystal grains 24 is not particularly limited. The number of the crystal grains 24 is not particularly limited as long as a plurality of crystal grains 24 are provided. In the piezoelectric layer 20, grain boundaries 26 are present between adjacent crystal grains 24. The grain boundaries 26 are observed by, for example, high angle annular dark-field scanning transmission electron microscopy (HAADF-STEM).

A ratio $N_{K1}/N_{K2}$ between an atom concentration $N_{K1}$ (atm %) of potassium contained in the grain boundaries 26 of the crystal grains 24 and an atom concentration $N_{K2}$ (atm %) of potassium contained in the crystal grains 24 is greater than 1.0 and equal to or greater than 1.2, equal to or greater than 1.5, or equal to or greater than 1.6, and equal to or less than 2.4, equal to or less than 2.0, or equal to or less than 1.8.

An atom concentration $N_{Na1}$ (atm %) of sodium contained in the grain boundaries 26 is, for example, lower than an atom concentration $N_{Na2}$ (atm %) of sodium contained in the crystal grains 24. A ratio $N_{Na1}/N_{Na2}$ between the atom concentration $N_{Na1}$ and the atom concentration $N_{Na2}$ is, for example, equal to or greater than 0.55 or equal to or greater than 0.60, and equal to or less than 0.75 or equal to or less than 0.70.

An atom concentration $N_{Nb1}$ (atm %) of niobium contained in the grain boundaries 26 is, for example, equal to an atom concentration $N_{Nb2}$ (atm %) of niobium contained in the crystal grains 24.

As illustrated in FIG. 2, the crystal grains 24 have a region 24a in a distance equal to or longer than 70 nm from centers of the grain boundaries 26. The atom concentration (atm %) of potassium at the centers of the grain boundaries 26 is, for example, higher than the atom concentration (atm %) of potassium in the region 24a. The atom concentration (atm %) of sodium at the centers of the grain boundaries 26 is, for example, lower than the atom concentration (atm %) of sodium in the region 24a. To be noted, in FIG. 2, the region 24a is illustrated for only one crystal grain 24 for the sake of convenience. The centers of the grain boundaries 26 are, for example, portions in which the atom concentration of potassium is highest. In addition, the centers of the grain boundaries 26 are, for example, portions in which the atom concentration of sodium is lowest.

Figure 3:
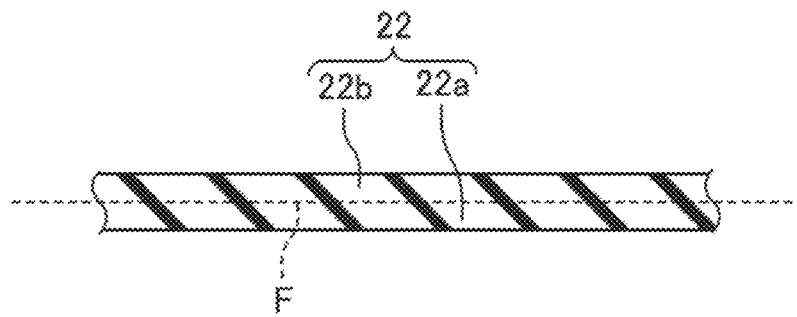
FIG. 3 is a schematic section view of a crystal grain-containing layer of the piezoelectric element according to the embodiment.

An atom concentration $N_{K3}$ (atm %) of potassium on the second electrode 30 side of each of the crystal grain-containing layers 22 is, for example, higher than an atom concentration $N_{K4}$ (atm %) of potassium on the first electrode 10 side of each of the crystal grain-containing layers 22. Each crystal grain-containing layer 22 includes, for example, a first portion 22a above a virtual plane F passing through the center of the crystal grain-containing layer 22 in the film thickness direction and a second portion 22b below the virtual plane F as illustrated in FIG. 3. The atom concentration $N_{K3}$ is an atom concentration of potassium in the first portion 22a. The atom concentration $N_{K4}$ is an atom concentration of potassium in the second portion 22b. A ratio $N_{K3}/N_{K4}$ between the atom concentration $N_{K3}$ and the atom concentration $N_{K4}$ is, for example, equal to or greater than 2.0 or equal to or greater than 3.0, and equal to or less than 4.0 or equal to or less than 3.8. To be noted, FIG. 3 is schematic section view of the crystal grain-containing layer 22.

An atom concentration $N_{Na3}$ (atm %) of sodium on the second electrode 30 side of each of the crystal grain-containing layers 22 is, for example, lower than an atom concentration $N_{Na4}$ (atm %) of sodium on the first electrode 10 side of each of the crystal grain-containing layers 22. The atom concentration $N_{Na3}$ is an atom concentration of sodium in the first portion 22a. The atom concentration $N_{Na4}$ is an atom concentration of sodium in the second portion 22b. A ratio $N_{Na3}/N_{Na4}$ between the atom concentration $N_{Na3}$ and the atom concentration $N_{Na4}$ is, for example, equal to or greater than 0.40 and equal to or less than 0.50.

An atom concentration $N_{Nb3}$ (atm %) of niobium on the second electrode 30 side of each of the crystal grain-containing layers 22 is, for example, lower than an atom concentration $N_{Nb4}$ (atm %) of niobium on the first electrode 10 side of each of the crystal grain-containing layers 22. The atom concentration $N_{Nb3}$ is an atom concentration of niobium in the first portion 22a. The atom concentration $N_{Nb4}$ is an atom concentration of niobium in the second portion 22b. A ratio $N_{Nb3}/N_{Nb4}$ between the atom concentration $N_{Nb3}$ and the atom concentration $N_{Nb4}$ is, for example, equal to or greater than 0.70 and equal to or less than 1.00.

The atom concentration ratios described above can be obtained by, for example, element mapping using energy dispersive X-ray spectrometry (EDX).

The second electrode 30 is provided above the piezoelectric layer 20. In the illustrated example, the second electrode 30 is provided on the piezoelectric layer 20. To be noted, although illustration is omitted, the second electrode 30 may be provided further on the side surface of the piezoelectric layer 20 and on the substrate 2.

The shape of the second electrode 30 is, for example, a layer shape. The thickness of the second electrode 30 is, for example, 15 nm to 300 nm. Examples of the second electrode 30 include metal layers such as an iridium layer and a platinum layer, layers of conductive oxides of these (for example, an iridium oxide layer), and a strontium ruthenate layer. The second electrode 30 may have a structure in which a plurality of the layers exemplified above are laminated.

The second electrode 30 is the other of the two electrodes for applying a voltage to the piezoelectric layer 20. The second electrode 30 is an upper electrode provided above the piezoelectric layer 20.

For example, the piezoelectric element 100 may be used for a liquid ejecting head, a printer including the liquid ejecting head, or an ultrasonic vibrator as a piezoelectric actuator for pressurizing a liquid in a pressure generating chamber, or may be used for other applications such as a piezoelectric sensor (ultrasonic sensor or gyro sensor) that detects deformation of the piezoelectric layer 20 as an electric signal.

The piezoelectric element 100 has, for example, the following features.

In the piezoelectric element 100, the atom concentration $N_{K1}$ and the atom concentration $N_{K2}$ satisfy a relationship of $1.0 < N_{K1}/N_{K2} \leq 2.4$. Therefore, the piezoelectric element 100 can have a better piezoelectric characteristic than in the case where, for example, $N_{K1}/N_{K2}$ is greater than 2.4 (see "Examples" that will be described later for details).

Further, in the piezoelectric element 100, cracks are less likely to be generated in the piezoelectric layer 20 than in the case where, for example, $N_{K1}/N_{K2}$ is equal to or less than 1. In the case where $N_{K1}/N_{K2}$ is equal to or less than 1, less potassium is present in the grain boundaries and more sodium is present in the grain boundaries than in the case where $N_{K1}/N_{K2}$ is greater than 1. Sodium crystallizes to generate $NaNbO_3$. $NaNbO_3$ is weaker against external force than $KNbO_3$ that potassium crystallizes to generate, and thus cracks are more likely to be generated therein. In addition, cracks are more likely to be generated in the grain boundaries than in the crystal grains. Therefore, in the case where more $NaNbO_3$ is present in the grain boundaries, cracks are more likely to be generated. Therefore, in the piezoelectric element 100, since less $NaNbO_3$ is present in the grain boundaries than in the case where, for example, $N_{K1}/N_{K2}$ is equal to or less than 1, cracks are less likely to be generated in the piezoelectric layer 20.

In the piezoelectric element 100, the atom concentration $N_{Na1}$ is lower than the atom concentration $N_{Na2}$. Therefore, the piezoelectric element 100 can more reliably have a better piezoelectric characteristic than in the case where, for example, the atom concentration $N_{Na1}$ is higher than the atom concentration $N_{Na2}$ (see "Examples" that will be described later for details).

In the piezoelectric element 100, the atom concentration $N_{Na1}$ and the atom concentration $N_{Na2}$ satisfy a relationship of $0.55 \leq N_{Na1}/N_{Na2} \leq 0.75$. Therefore, the piezoelectric element 100 can more reliably have a better piezoelectric characteristic than in the case where, for example, the relationship of $0.55 \leq N_{Na1}/N_{Na2} \leq 0.75$ is not satisfied (see "Examples" that will be described later for details).

In the piezoelectric element 100, the atom concentration $N_{K1}$ and the atom concentration $N_{K2}$ satisfy a relationship of $1.5 \leq N_{K1}/N_{K2} \leq 2.0$. Therefore, the piezoelectric element 100 can more reliably have a better piezoelectric characteristic than in the case where, for example, the relationship of $1.5 \leq N_{K1}/N_{K2} \leq 2.0$ is not satisfied (see "Examples" that will be described later for details).

In the piezoelectric element 100, the atom concentration $N_{K3}$ is higher than the atom concentration $N_{K4}$. Therefore, the piezoelectric element 100 can more reliably have a better piezoelectric characteristic than in the case where, for example, the atom concentration $N_{K3}$ is lower than the atom concentration $N_{K4}$ (see "Examples" that will be described later for details).

In the piezoelectric element 100, the atom concentration $N_{K3}$ and the atom concentration $N_{K4}$ satisfy a relationship of $2.0 \leq N_{K3}/N_{K4} \leq 4.0$. Therefore, the piezoelectric element 100 can more reliably have a better piezoelectric characteristic than in the case where, for example, the relationship of $2.0 \leq N_{K3}/N_{K4} \leq 4.0$ is not satisfied (see "Examples" that will be described later for details).

In the piezoelectric element 100, the atom concentration $N_{Na3}$ is lower than the atom concentration $N_{Na4}$. Therefore, the piezoelectric element 100 can more reliably have a better piezoelectric characteristic than in the case where, for example, the atom concentration $N_{Na3}$ is higher than the atom concentration $N_{Na4}$ (see "Examples" that will be described later for details).

In the piezoelectric element 100, the atom concentration of potassium at the centers of the grain boundaries 26 is higher than the atom concentration of potassium in the region 24a. Therefore, the piezoelectric element 100 can more reliably have a better piezoelectric characteristic than in the case where, for example, the atom concentration of potassium at the centers of the grain boundaries 26 is lower than the atom concentration of potassium in the region 24a (see "Examples" that will be described later for details).

In the piezoelectric element 100, the atom concentration of sodium at the centers of the grain boundaries 26 is lower than the atom concentration of sodium in the region 24a. Therefore, the piezoelectric element 100 can more reliably have a better piezoelectric characteristic than in the case where, for example, the atom concentration of sodium at the centers of the grain boundaries 26 is higher than the atom concentration of sodium in the region 24a (see "Examples" that will be described later for details).

2. PRODUCTION METHOD OF PIEZOELECTRIC ELEMENT

Next, a production method of the piezoelectric element 100 according to the present embodiment will be described with reference to drawings.

As illustrated in FIG. 1, the substrate 2 is prepared. Specifically, a silicon oxide layer is formed by thermally oxidizing a silicon substrate. Next, a zirconium layer is formed on the silicon oxide layer by a sputtering method or the like, and a zirconium oxide layer is formed by oxidizing the zirconium layer. The substrate 2 can be prepared in accordance with the steps described above.

Next, the first electrode 10 is formed on the substrate 2. The first electrode 10 is formed by, for example, a sputtering method or a vacuum deposition method. Next, the first electrode 10 is patterned by, for example, photolithography and etching.

Next, the piezoelectric layer 20 is formed on the first electrode 10. The piezoelectric layer 20 is formed by, for example, a chemical solution deposition (CSD) method such as a sol-gel method or metal organic deposition (MOD). A formation method of the piezoelectric layer 20 will be described below.

A metal complex containing potassium, a metal complex containing sodium, and a metal complex containing niobium are dissolved or dispersed in an organic solvent to prepare a precursor solution. The precursor solution may contain a metal complex containing manganese.

The prepared precursor solution is applied on the first electrode 10 by using a spin coating method to form a precursor layer (application step). Next, the precursor layer is heated to, for example, 130° C. to 250° C. and dried for a certain period (drying step). Further, the dried precursor layer is degreased by heating the precursor layer and keeping the precursor layer at, for example, 300° C. to 450° C. for a certain period (degreasing step). Next, the degreased precursor layer is crystallized by heating the precursor layer and keeping the precursor layer at, for example, 600° C. to 750° C. for a certain period (firing step).

To be noted, heat treatment may be performed at, for example, 80° C. to 100° C. between the degreasing step and the firing step. By this heat treatment, for example, generation of cracks in the piezoelectric layer 20 can be suppressed.

A crystal grain-containing layer 22 can be formed in accordance with the steps described above. Further, the piezoelectric layer 20 constituted by the plurality of crystal grain-containing layers 22 can be formed by repetitively performing this series of steps from the application step to the firing step.

Examples of the metal complex containing potassium include potassium 2-ethylhexanoate and potassium acetate. Examples of the metal complex containing sodium include sodium 2-ethylhexanoate and sodium acetate. Examples of the metal complex containing niobium include niobium 2-ethylhexanoate and niobium pentaethoxide. Examples of the metal complex containing manganese include manganese 2-ethylhexanoate. To be noted, two or more kinds of metal complexes may be used in combination. For example, potassium 2-ethylhexanoate and potassium acetate may be used together as the metal complex containing potassium.

Examples of the solvent include propanol, butanol, pentanol, hexanol, octanol, ethylene glycol, propylene glycol, octane, decane, cyclohexane, xylene, toluene, tetrahydrofuran, acetic acid, octylic acid, 2-n-butoxyethanol, n-octane, and mixture solvents of these.

Examples of a heating apparatus used in the drying step, the degreasing step, and the firing step for forming the crystal grain-containing layers 22 include a rapid thermal annealing (RTA) apparatus that performs heating by radiation of infrared light.

Next, the piezoelectric layer 20 is heated by, for example, a furnace annealing (FA) apparatus (heating furnace) at 650° C. to 750° C., and is maintained at this temperature for a certain period of time.

Next, the piezoelectric layer 20 is patterned by, for example, photolithography and etching. To be noted, the first electrode 10 and the piezoelectric layer 20 may be patterned in the same step. Alternatively, the first electrode 10 and the first crystal grain-containing layer 22 may be patterned in the same step, and the second and subsequent crystal grain-containing layers 22 may be formed thereafter.

Next, the second electrode 30 is formed on the piezoelectric layer 20. The second electrode 30 is formed by, for example, a sputtering method or a vacuum deposition method. Next, the second electrode 30 is patterned by, for example, photolithography and etching.

Next, the piezoelectric layer 20 is heated by an RTA apparatus to a predetermined temperature (600° C. to 760° C.), and is held at this temperature for a certain period of time (3 minutes to 6 minutes). The temperature raising rate of raising the temperature to the predetermined temperature is 40° C./sec to 55° C./sec. By performing the heat treatment at the heating temperature, the holding time, and the temperature raising rate described above, the piezoelectric element 100 satisfying the relationship of $1.0 < N_{K1}/N_{K2} \leq 2.4$ can be formed. In the case where the temperature of the heat treatment by the RTA apparatus is higher than 760° C., potassium contained in the piezoelectric layer 20 sometimes melts.

The piezoelectric element 100 can be prepared in accordance with the steps described above.

3. LIQUID EJECTING HEAD

Figure 4:
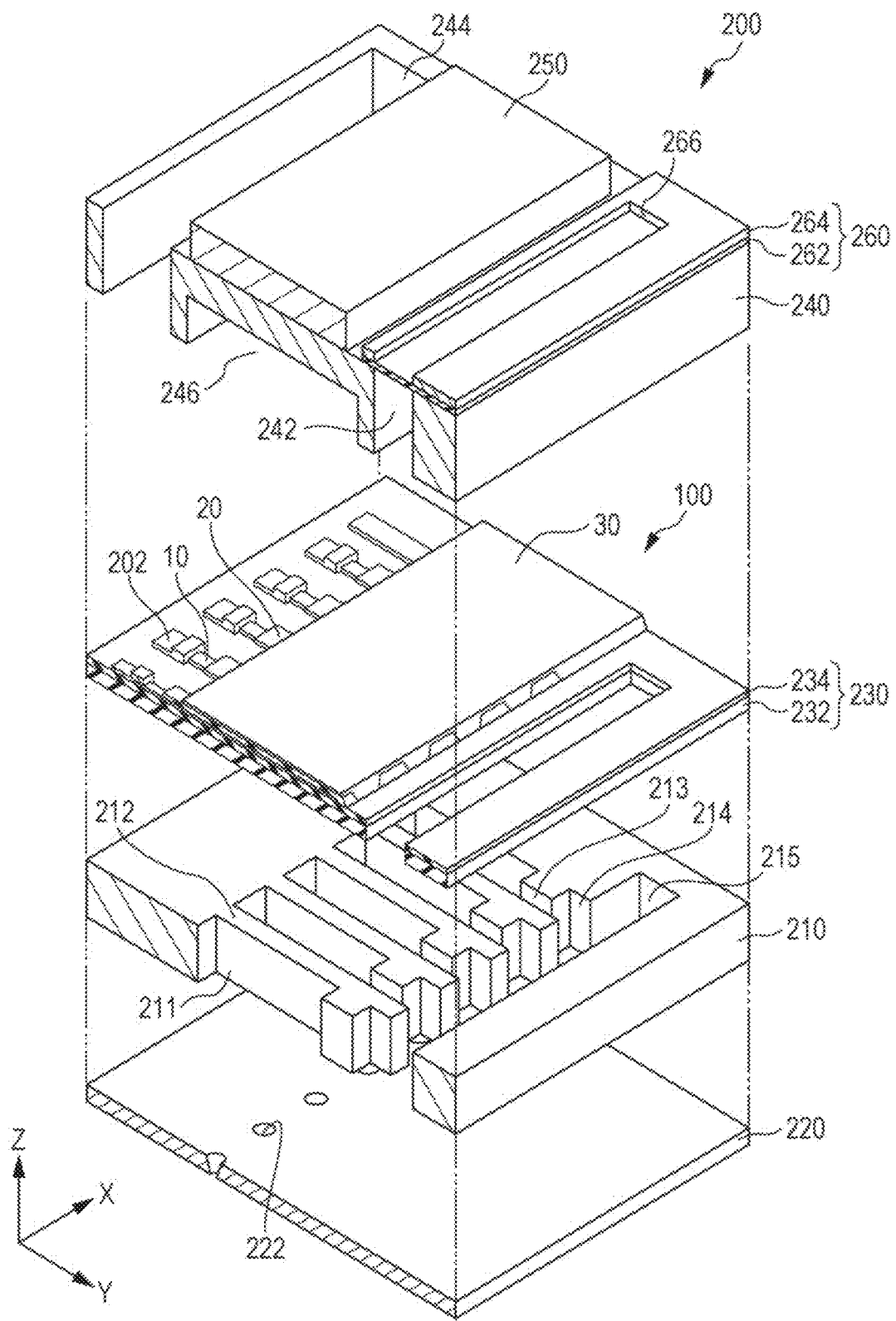
FIG. 4 is a schematic exploded perspective view of a liquid ejecting head according to the embodiment.
Figure 5:
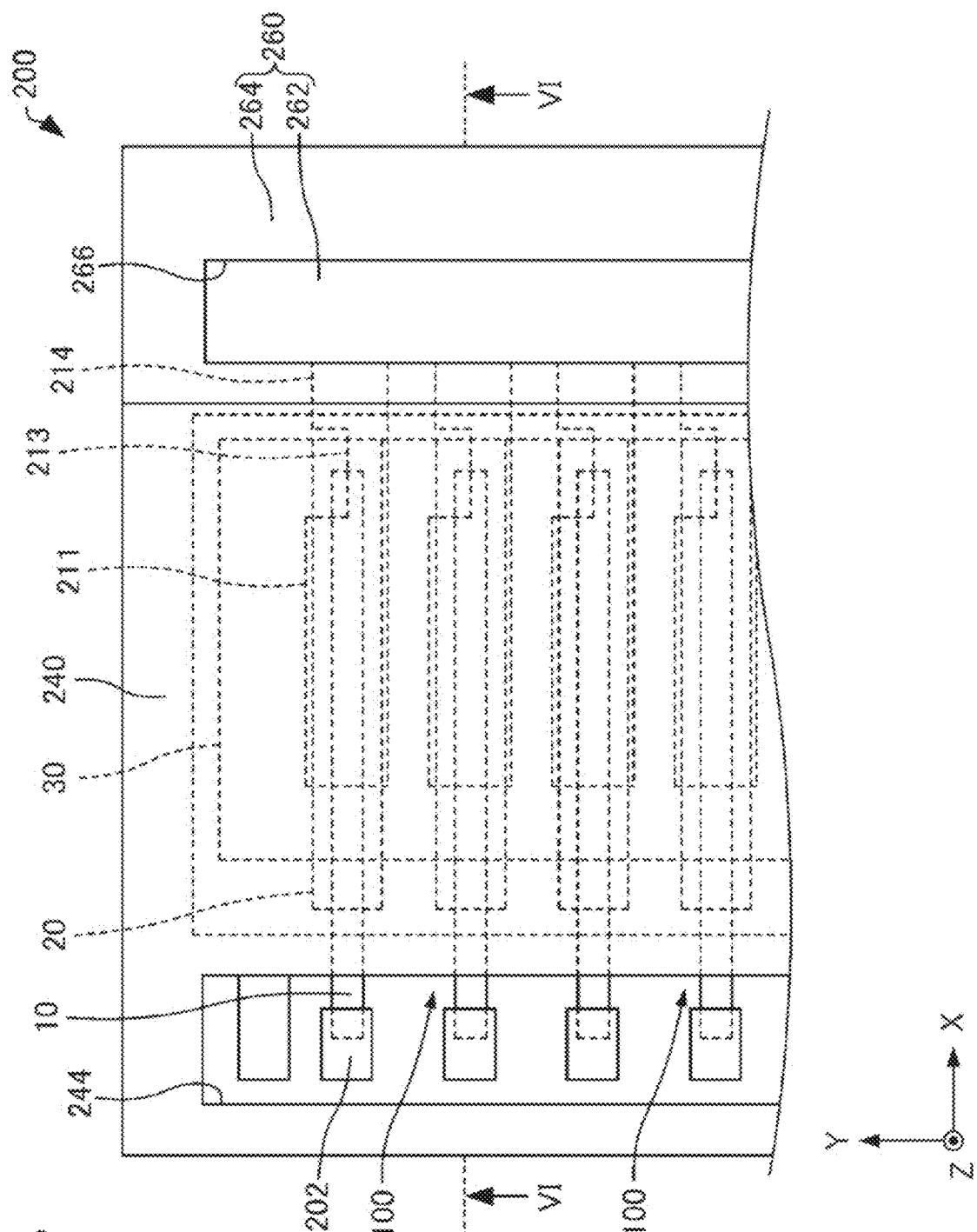
FIG. 5 is a schematic plan view of the liquid ejecting head according to the embodiment.
Figure 6:
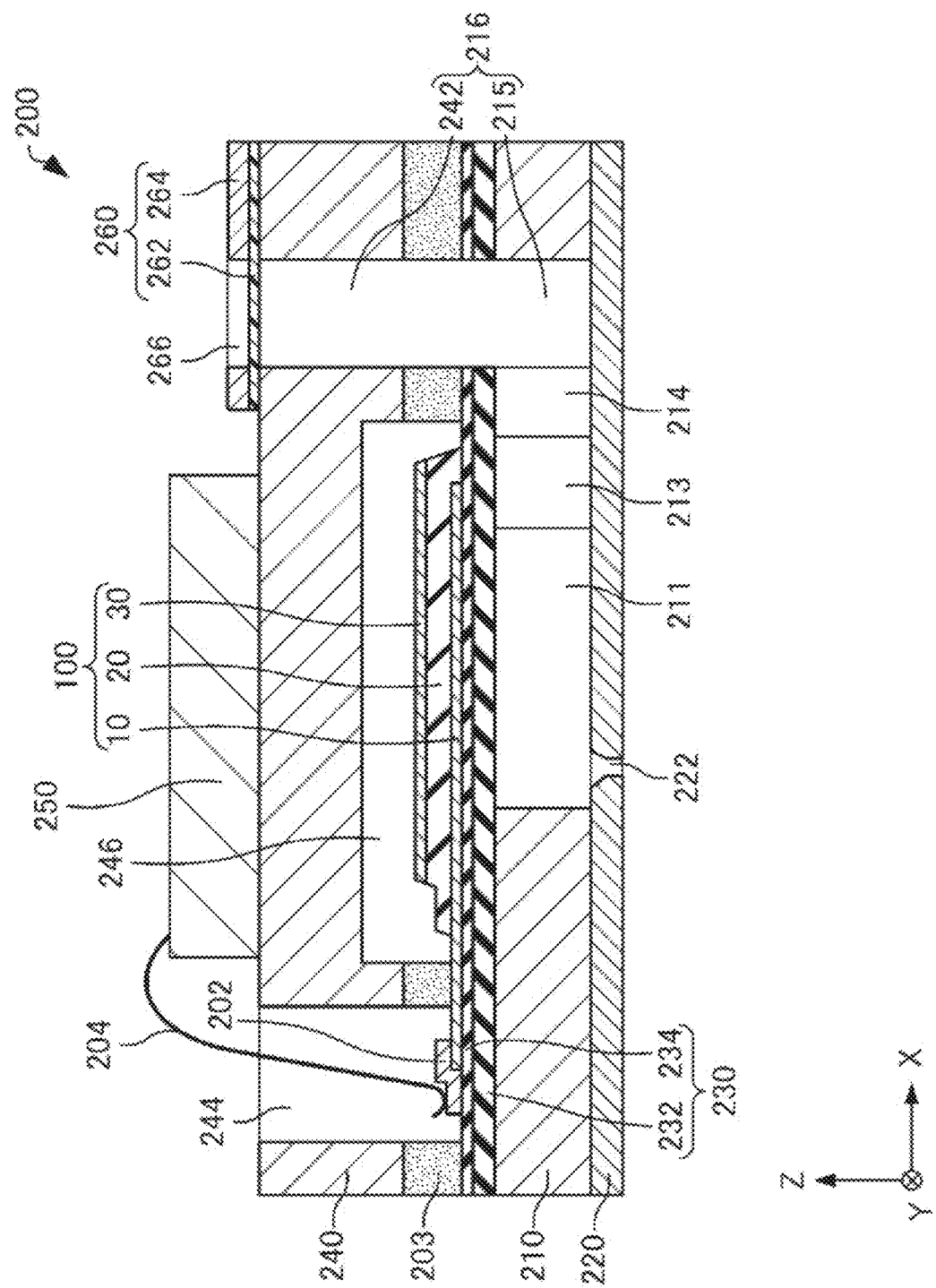
FIG. 6 is a schematic section view of the liquid ejecting head according to the embodiment.

Next, a liquid ejecting head according to the present embodiment will be described with reference to drawings. FIG. 4 is a schematic exploded perspective view of a liquid ejecting head 200 according to the present embodiment. FIG. 5 is a schematic plan view of the liquid ejecting head 200 according to the present embodiment. FIG. 6 is a schematic section view of the liquid ejecting head 200 according to the present embodiment taken along a line VI-VI of FIG. 5. To be noted, an X axis, a Y axis, and a Z axis are shown as three axes perpendicular to one another in FIGS. 4 to 6.

A liquid ejecting head according to the invention includes the piezoelectric element according to the invention. The liquid ejecting head 200 including the piezoelectric element 100 will be described below as an example.

As illustrated in FIGS. 4 to 6, the liquid ejecting head 200 includes, for example, the piezoelectric element 100, a channel-defining substrate 210, a nozzle plate 220, a diaphragm 230, a protective substrate 240, a circuit board 250, and a compliance substrate 260. To be noted, illustration of the circuit board 250 is omitted in FIG. 5 for the sake of convenience.

The channel-defining substrate 210 is, for example, a silicon substrate. Pressure generating chambers 211 are provided in the channel-defining substrate 210. The pressure generating chambers 211 are partitioned by a plurality of partition walls 212.

In the channel-defining substrate 210, an ink supply path 213 and a communication path 214 are provided at an end portion of each of the pressure generating chambers 211 on the +X side. The ink supply path 213 is defined such that the opening area thereof shrinks when the end portion of the pressure generating chamber 211 on the +X side is squeezed in the Y axis direction. The size of the communication path 214 in the Y axis direction is, for example, the same as the size of the pressure generating chamber 211 in the Y axis direction. A communication portion 215 is provided on the +X side of the communication path 214. The communication portion 215 constitutes part of a manifold 216. The manifold 216 serves as a common ink chamber of the pressure generating chambers 211. As described above, liquid channels each including the pressure generating chamber 211, the ink supply path 213, the communication path 214, and the communication portion 215 are defined in the channel-defining substrate 210.

The nozzle plate 220 is provided on one surface (surface on the −Z side) of the channel-defining substrate 210. The material of the nozzle plate 220 is, for example, steel use stainless (SUS). The nozzle plate 220 is joined to the channel-defining substrate 210 by, for example, a glue or a heat sealing film. Nozzle openings 222 are arranged along the Y axis in the nozzle plate 220. The nozzle openings 222 communicate with the pressure generating chambers 211.

The diaphragm 230 is provided on the other surface (surface on the +Z side) of the channel-defining substrate 210. The diaphragm 230 is constituted by, for example, a first insulator layer 232 formed on the channel-defining substrate 210 and a second insulator layer 234 provided on the first insulator layer 232. The first insulator layer 232 is, for example, a silicon oxide layer. The second insulator layer 234 is, for example, a zirconium oxide layer.

The piezoelectric element 100 is provided on, for example, the diaphragm 230. The piezoelectric element 100 is provided in a plural number. The number of the piezoelectric elements 100 is not particularly limited.

In the liquid ejecting head 200, the diaphragm 230 and the first electrodes 10 are displaced by deformation of the piezoelectric layers 20 having an electromechanical conversion characteristic. That is, in the liquid ejecting head 200, the diaphragm 230 and the first electrodes 10 substantially has a function as a diaphragm. To be noted, the diaphragm 230 may be omitted and the first electrodes 10 may be configured to function as a diaphragm by themselves. In the case of providing the first electrodes 10 directly on the channel-defining substrate 210, it is preferable to protect the first electrodes 10 by an insulating protective film or the like such that ink does not directly contact the first electrodes 10.

The first electrodes 10 are each configured as an individual electrode independent for each of the pressure generating chamber 211. The size of the first electrode 10 in the Y axis direction is, for example, smaller than the size of the pressure generating chamber 211 in the Y axis direction. The size of the first electrode 10 in the X axis direction is, for example, smaller than the size of the pressure generating chamber 211 in the X axis direction. Both end portions of the first electrode 10 in the X axis direction are positioned further on the outside than both end portions of the pressure generating chamber 211. A leading electrode 202 is connected to the end portion of the first electrode 10 on the −X side.

The size of the piezoelectric layer 20 in the Y axis direction is, for example, larger than the size of the first electrode 10 in the Y axis direction. The size of the piezoelectric layer 20 in the X axis direction is, for example, larger than the size of the pressure generating chamber 211 in the X axis direction. The end portion of the piezoelectric layer 20 on the +X side is, for example, positioned further on the outside (on the +X side) than the end portion of the first electrode 10 on the +X side. That is, the end portion of the first electrode 10 on the +X side is covered by the piezoelectric layer 20. Meanwhile, the end portion of the piezoelectric layer 20 on the −X side is, for example, positioned further on the inside (on the +X side) than the end portion of the first electrode 10 on the −X side. That is, the end portion of the first electrode 10 on the −X side is not covered by the piezoelectric layer 20.

The second electrode 30 is continuously provided on the piezoelectric layers 20 and the diaphragm 230. The second electrode 30 is configured as a common electrode shared by a plurality of piezoelectric elements 100. To be noted, although not illustrated, the first electrode 10 instead of the second electrode 30 may be configured as a common electrode.

The protective substrate 240 is joined to the channel-defining substrate 210 by a glue 203. The protective substrate 240 is provided with a through hole 242. In the illustrated example, the through hole 242 penetrates through the protective substrate 240 in the Z axis direction and communicates with the communication portion 215. The through hole 242 and the communication portion 215 constitute the manifold 216 serving as a common ink chamber for the pressure generating chambers 211. Further, the protective substrate 240 is provided with a through hole 244 penetrating through the protective substrate 240 in the Z axis direction. End portions of the leading electrodes 202 are positioned at the through hole 244.

The protective substrate 240 is provided with an opening portion 246. The opening portion 246 is a space for not hindering driving of the piezoelectric elements 100. The opening portion 246 may be sealed or not sealed.

The circuit board 250 is provided on the protective substrate 240. The circuit board 250 includes a semiconductor integrated circuit (IC) for driving the piezoelectric elements 100. The circuit board 250 and the leading electrodes 202 are electrically interconnected via the connection wiring 204.

The compliance substrate 260 is provided on the protective substrate 240. The compliance substrate 260 includes a sealing layer 262 provided on the protective substrate 240 and a fixing board 264 provided on the sealing layer 262. The sealing layer 262 is a layer for sealing the manifold 216. For example, the sealing layer 262 is flexible. The fixing board 264 is provided with a through hole 266. The through hole 266 penetrates through the fixing board 264 in the Z axis direction. The through hole 266 is provided at such a position as to overlap the manifold 216 in plan view (as viewed in the Z axis direction).

4. PRINTER

Figure 7:
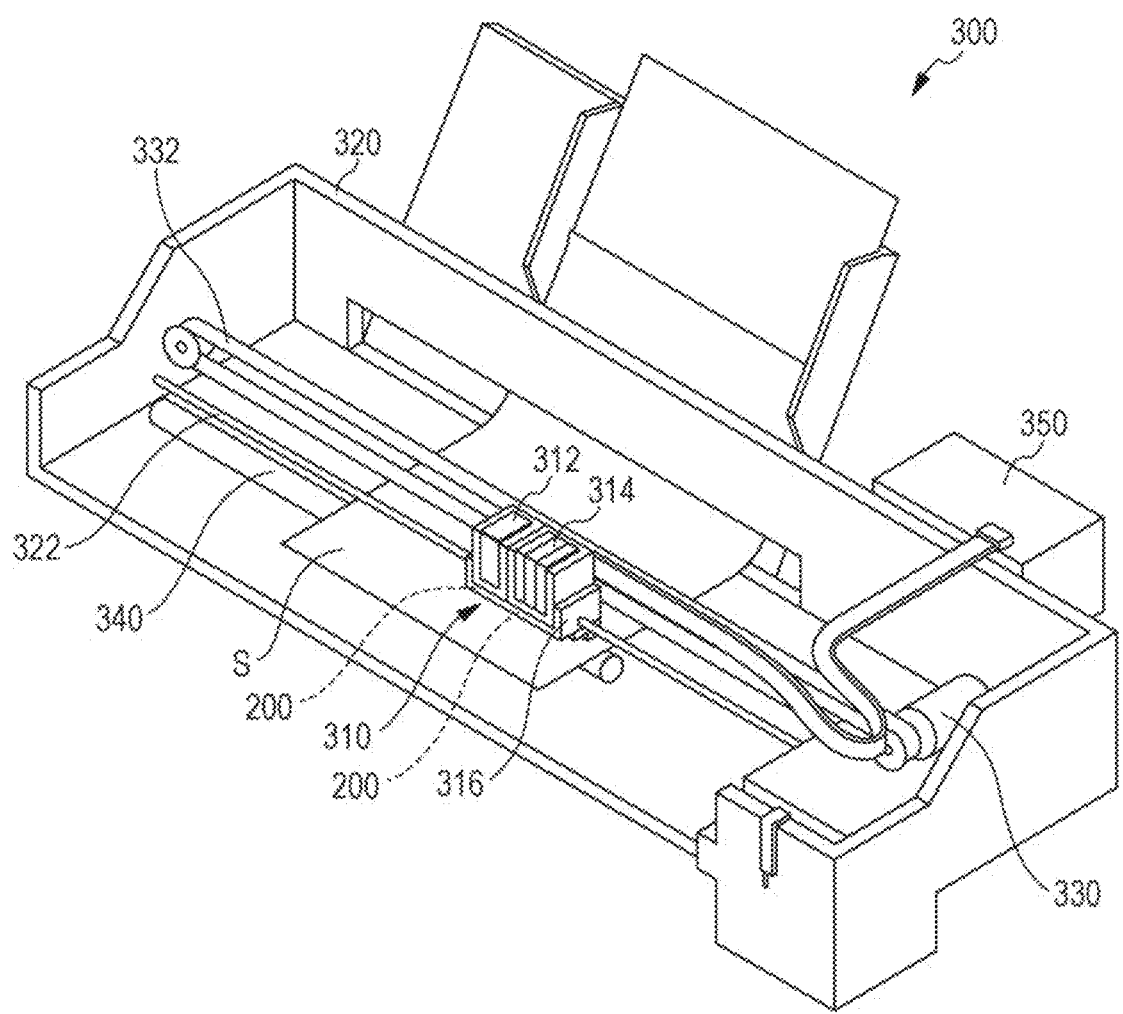
FIG. 7 is a schematic perspective view of a printer according to the embodiment.

Next, a printer according to the present embodiment will be described with reference to drawings. FIG. 7 is a schematic perspective view of a printer 300 according to the present embodiment.

A printer according to the invention includes the liquid ejecting head according to the invention. The printer 300 including the liquid ejecting head 200 will be described below as an example.

The printer 300 is an ink jet printer. As illustrated in FIG. 7, the printer 300 includes a head unit 310. The head unit 310 includes liquid ejecting heads 200. The number of the liquid ejecting heads 200 is not particularly limited. Cartridges 312 and 314 constituting an ink supply unit are attachably and detachably provided in the head unit 310. A carriage 316 mounting the head unit 310 is provided, on a carriage shaft 322 attached to an apparatus body 320, so as to be movable in the shaft direction, and for example, ejects a black ink composition and color ink compositions.

In the printer 300, the carriage 316 mounting the head unit 310 is moved along the carriage shaft 322 as a result of driving force of a driving motor 330 being transmitted to the carriage 316 via a plurality of unillustrated gears and a timing belt 332. Meanwhile, the apparatus body 320 is provided with a transport roller 340 serving as a transport unit, and a recording sheet S that is a recording medium of paper or the like is transported by the transport roller 340. The transport unit that transports the recording sheet S is not limited to a transport roller, and may be a belt, a drum, or the like.

The printer 300 includes a printer controller 350. The printer controller 350 is electrically connected to the circuit board 250 (see FIG. 6) of the liquid ejecting head 200. The printer controller 350 includes, for example, a control portion constituted by a random access memory (RAM) for temporarily storing various data, a read only memory (ROM) storing control programs and the like, a central processing unit (CPU), and the like, a drive signal generation circuit for generating a drive signal to be supplied to the liquid ejecting head 200, and so forth.

5. EXPERIMENTAL EXAMPLES

The invention will be described more in detail with reference to the following experimental examples. To be noted, the invention should not be limited by the following experimental examples.

5.1. Preparation of Samples 5.1.1. Example 1

A silicon dioxide layer was formed on a silicon substrate by thermally oxidizing a six-inch silicon substrate. Next, a zirconium layer was formed on the silicon dioxide layer by a sputtering method, and a zirconium oxide layer was formed by thermally oxidizing the zirconium layer. In this manner, a diaphragm including a silicon dioxide layer and a zirconium oxide layer was formed.

Then, a platinum layer (first electrode) was formed on the diaphragm by a sputtering method while raising the temperature to 450° C.

Next, solutions containing potassium 2-ethylhexanoate, sodium 2-ethylhexanoate, niobium 2-ethylhexanoate, and manganese 2-ethylhexanoate were compounded into a composition of $(K_{0.6}, Na_{0.4})_A(Nb_{0.995}, Mn_{0.005})_BO_3$, and the composition was applied on the first electrode by a spin-coating method. At this time, the compounding was performed such that A/B=1.07 was satisfied. Next, drying was performed at 180° C., degreasing was performed at 380° C., and then heat treatment was performed at 90° C. After this, heat treatment was performed at 600° C. for 3 minutes by an RTA apparatus for crystallization. These steps from application to heat treatment for crystallization were repeated 6 times. Then, heat treatment was performed at 700° C. for 10 minutes by a FA apparatus. In this manner, a piezoelectric layer having a thickness of about 450 nm was formed.

Next, a platinum layer (second electrode) was formed on the piezoelectric layer by a sputtering method while raising the temperature to 200° C.

Next, heat treatment was performed at 750° C. for 5 minutes by an RTA apparatus. In this heat treatment, the temperature was raised from a room temperature to 750° C.

at a temperature raising rate of 40° C./sec to 50° C./sec, and was held at 750° C. for 5 minutes.

5.1.2. Example 2

Example 2 was the same as Example 1 except that the temperature of the heat treatment (RTA treatment) by the RTA apparatus after forming the second electrode was changed to 650° C.

5.1.3. Example 3

Example 3 was the same as Example 1 except that the heat treatment (FA treatment) by the FA apparatus was performed at 600° C. for 5 minutes.

5.1.4. Example 4

Example 4 was the same as Example 1 except that the FA treatment was performed at 600° C. for 5 minutes and further the RTA treatment was performed at 650° C.

5.1.5. Comparative Example 1

Comparative Example 1 was the same as Example 1 except that the RTA treatment was not performed.

5.1.6. Comparative Example 2

Comparative Example 2 was the same as Comparative Example 1 except that the FA treatment was performed at 600° C.

5.1.7. Comparative Example 3

Comparative Example 3 was the same as Comparative Example 1 except that A/B was set to 1.00, the heat treatment at 90° C. after the degreasing step was not performed, and a piezoelectric layer of a thickness of about 590 nm was formed by repeating the steps from application to heat treatment for crystallization 8 times.

5.1.8. Comparative Example 4

Comparative Example 4 was the same as Comparative Example 3 except that A/B was set to 1.04.

5.1.9. Comparative Example 5

Comparative Example 5 was the same as Comparative Example 3 except that A/B was set to 1.10.

5.2. Hysteresis Measurement

Figure 10:
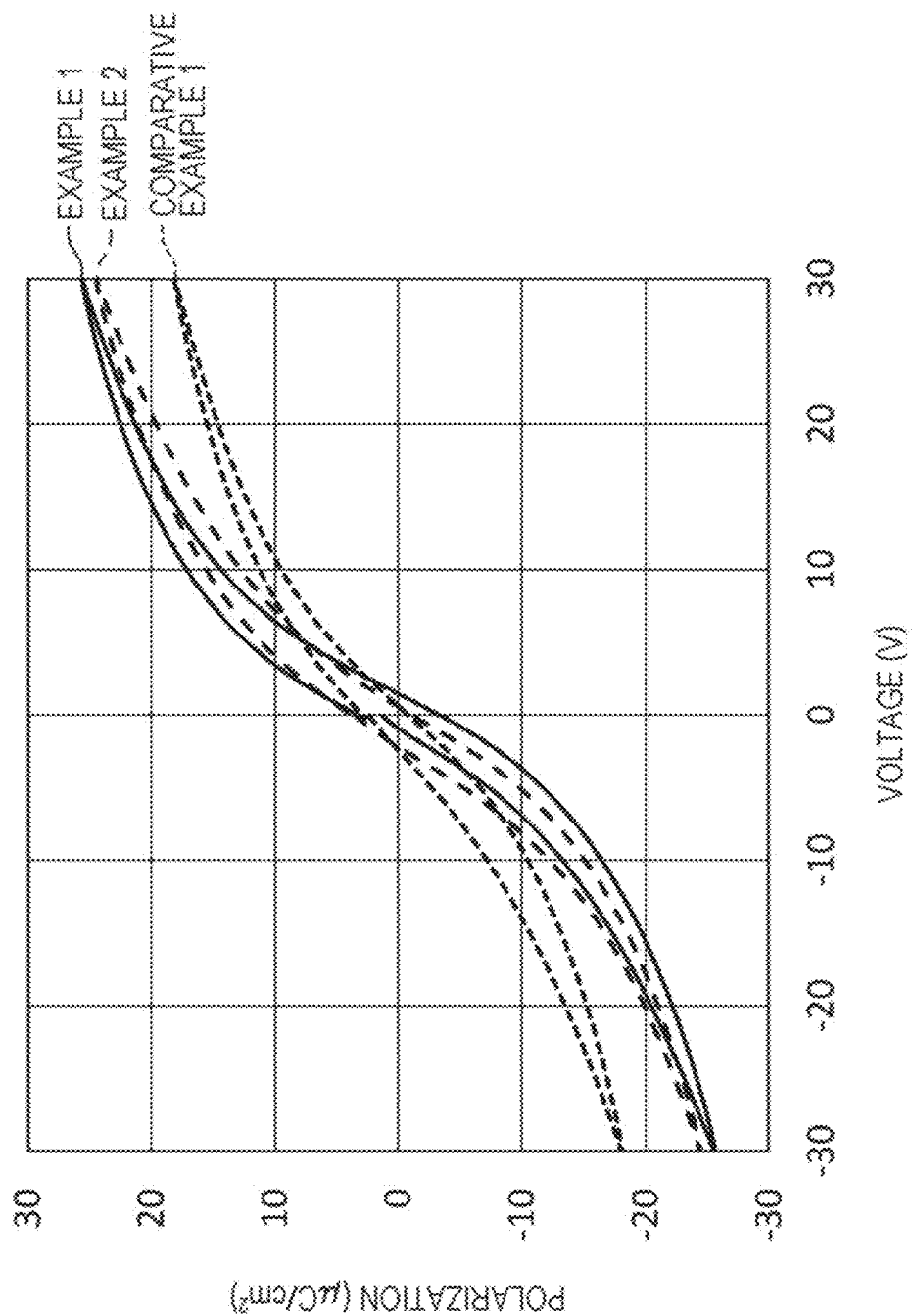
FIG. 10 is a graph showing results of hysteresis measurement of Examples 1 and 2 and Comparative Example 1.

Hysteresis measurement (P-E hysteresis) was performed on piezoelectric elements of Examples 1 to 4 and Comparative Examples 1 to 5 prepared in the above-described manner. The hysteresis was measured at a frequency of 1 kHz by using "FCE-1A" manufactured by TOYO Corporation. FIG. 8 is a table showing saturation polarization values Pm of Examples 1 to 4 and Comparative Examples 1 and 2. FIG. 9 is a table showing saturation polarization values Pm of Comparative Examples 3 to 5. FIG. 10 is a graph showing results of hysteresis measurement of Examples 1 and 2 and Comparative Example 1.

From FIGS. 8 and 10, it was found that the heat treatment by the RTA apparatus after forming the second electrode increases the saturation polarization value Pm. Therefore, it was found that good piezoelectric characteristics can be achieved by the heat treatment by the RTA apparatus after forming the second electrode. Further, the saturation polarization values Pm increased more in the case where the temperature of the heat treatment by the RTA apparatus after forming the second electrode was higher. To be noted, the heat treatment by the RTA apparatus after forming the second electrode can also reduce leak current.

As can be seen from FIG. 9, the saturation polarization value Pm was larger in the case where A/B was larger. However, in Comparative Example 5, A/B was too large and cracks were generated in the piezoelectric layer. It can be said that A/B=1.07 is preferable to increase the saturation polarization value Pm without occurrence of cracks.

5.3. HAADF-STEM Measurement

HAADF-STEM measurement was performed on piezoelectric elements of Examples 1 and 2 and Comparative Example 1 prepared in the above-described manner. The HAADF-STEM measurement was performed by using "ACCELARM" manufactured by JEOL Ltd.

Figure 11:
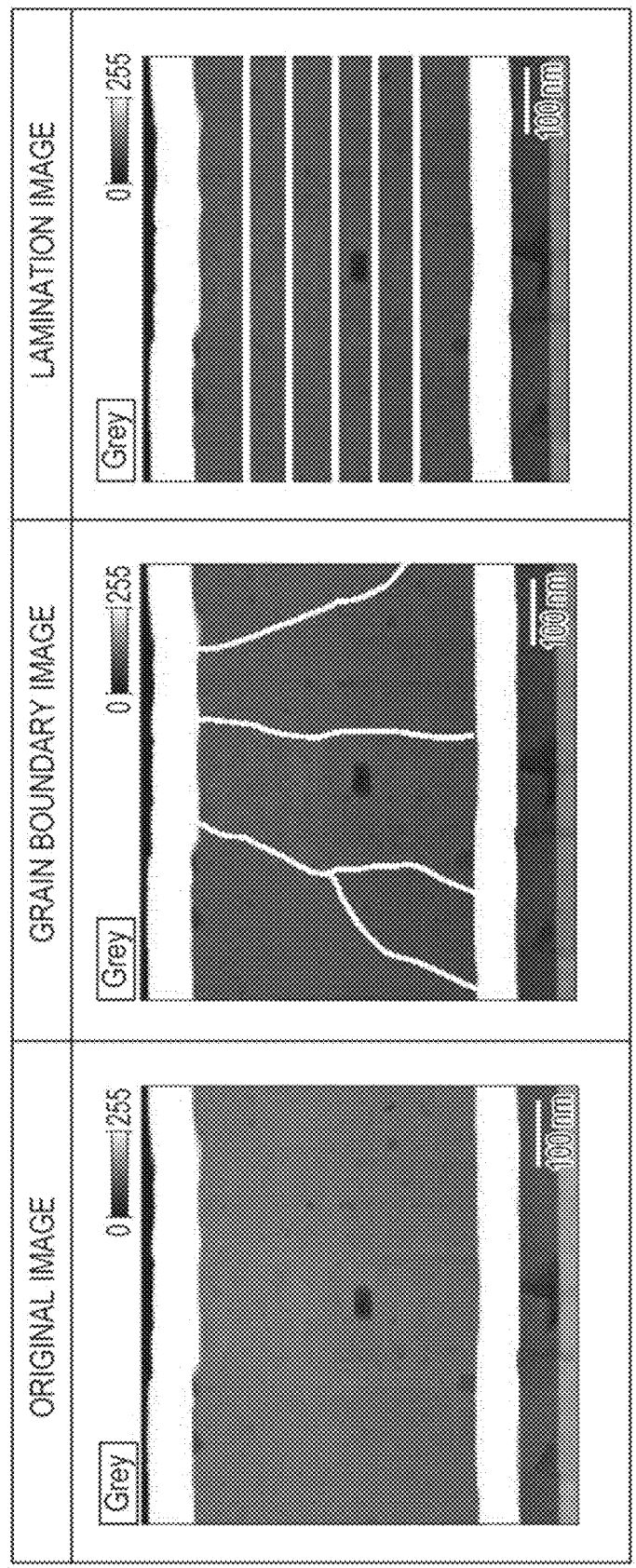
FIG. 11 shows HAADF-STEM images of Example 1.
Figure 12:
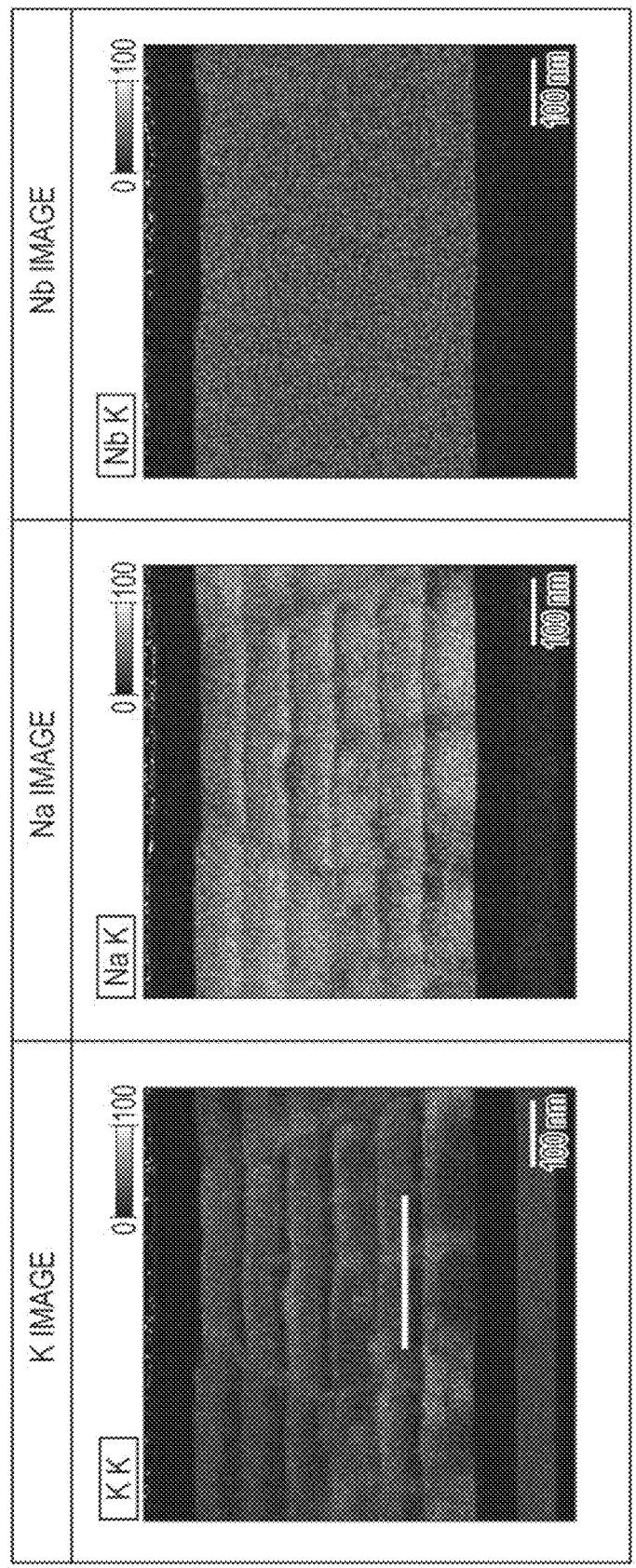
FIG. 12 shows results of element mapping of Example 1.
Figure 13:
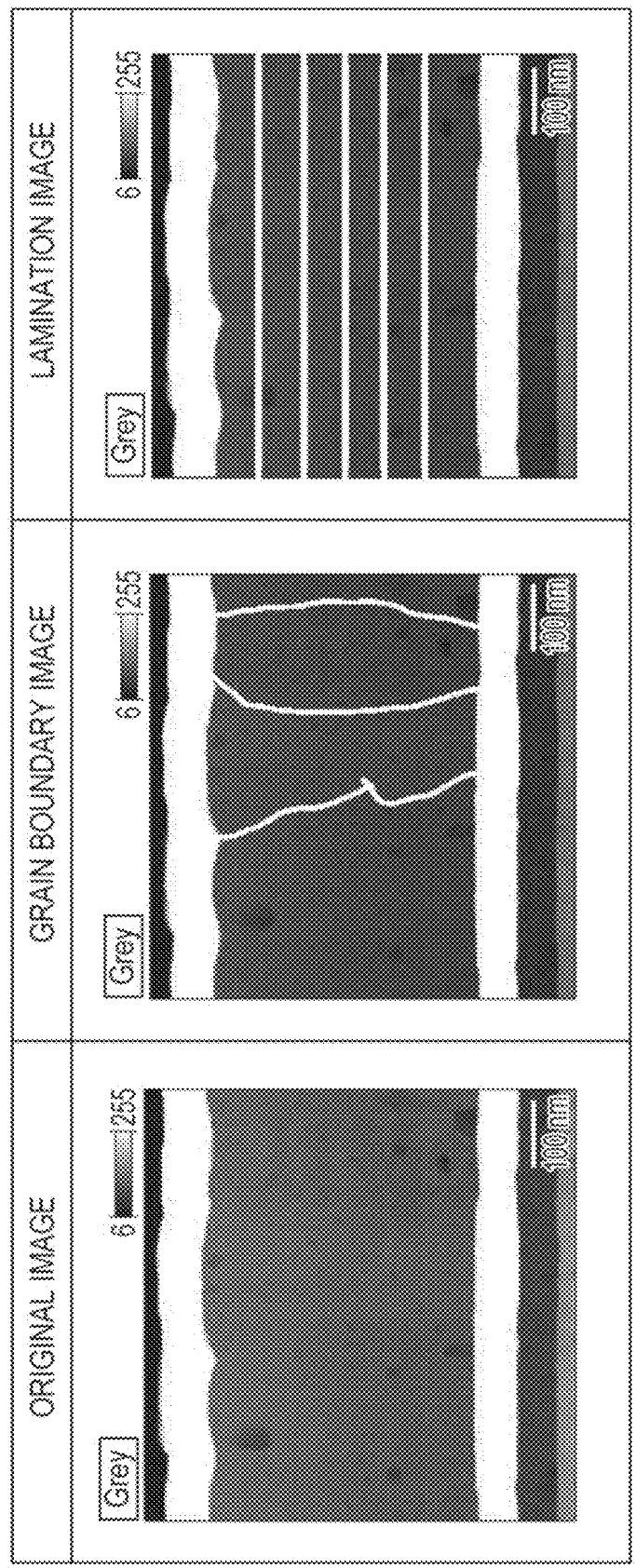
FIG. 13 shows HAADF-STEM images of Example 2.
Figure 14:
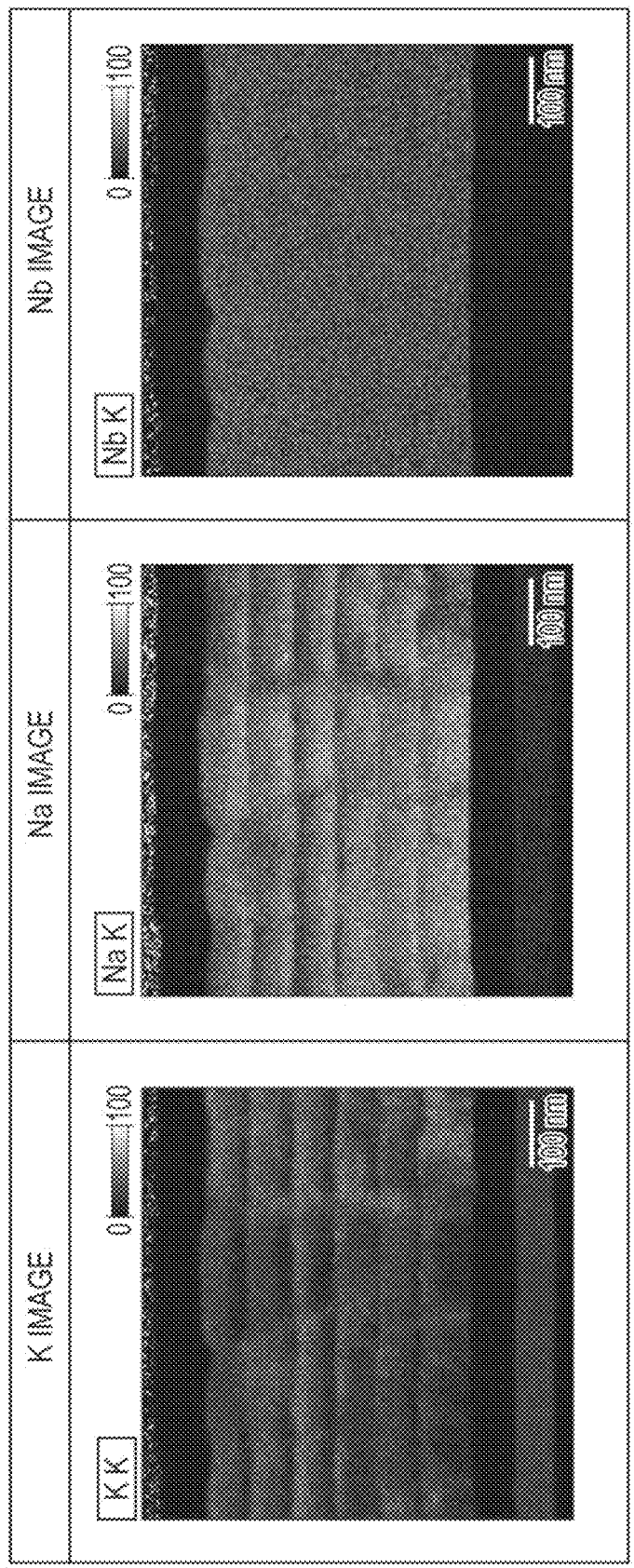
FIG. 14 shows results of element mapping of Example 2.
Figure 15:
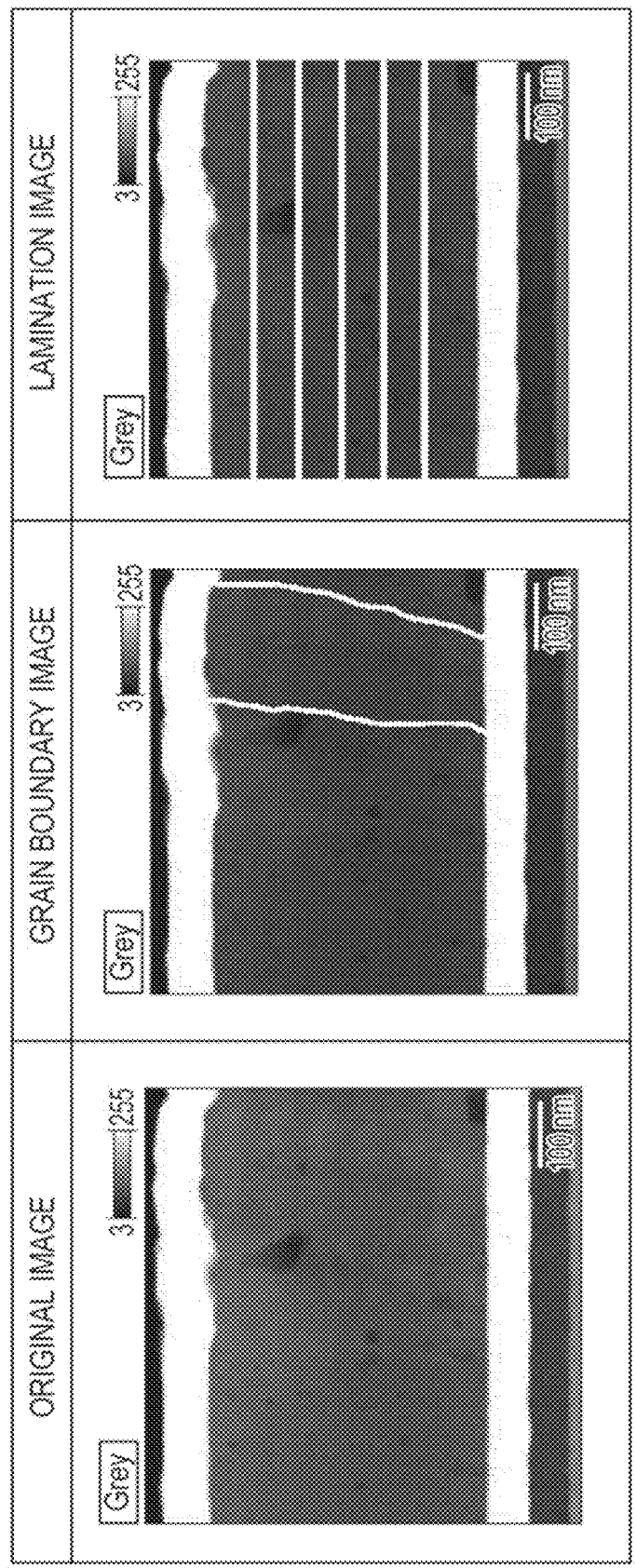
FIG. 15 shows HAADF-STEM images of Comparative Example 1.
Figure 16:
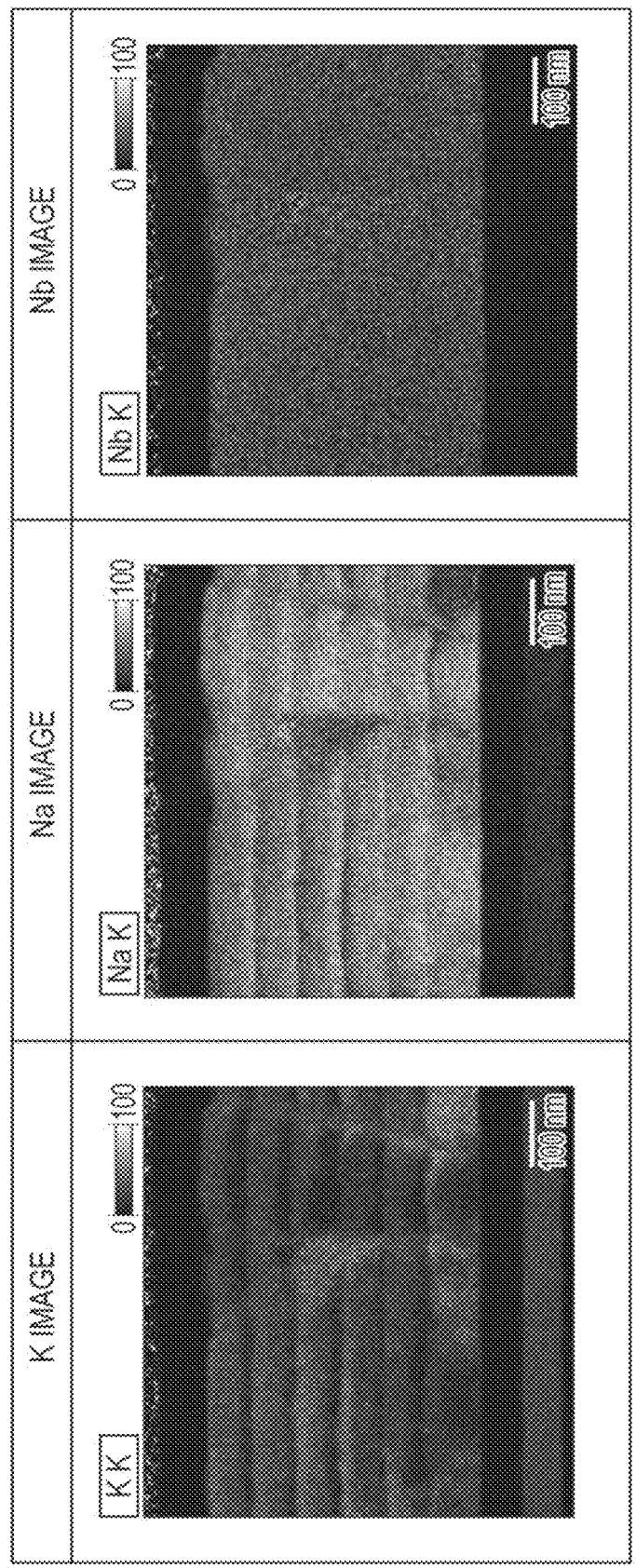
FIG. 16 shows results of element mapping of Comparative Example 1.

FIG. 11 shows HAADF-STEM images of Example 1. FIG. 12 shows results of element mapping of Example 1. FIG. 13 shows HAADF-STEM images of Example 2. FIG. 14 shows results of element mapping of Example 2. FIG. 15 shows HAADF-STEM images of Comparative Example 1. FIG. 16 shows results of element mapping of Comparative Example 1.

FIGS. 11, 13, and 15 show images (original images) obtained by the HAADF-STEM measurement, images (grain boundary images) in which grain boundaries in the original images are shown, and images (lamination images) in which lamination structures in the original images are shown (boundaries between crystal grain-containing layers are shown). The grain boundaries are boundaries between regions having different periodicities of pattern in the film thickness direction of the piezoelectric layer or regions having different colors (intensities).

FIGS. 12, 14, and 16 respectively show distributions of potassium, sodium, and niobium in the same field of view of the HAADF-STEM images of FIGS. 11, 13, and 15 by energy dispersive X-ray spectrometry (EDX). FIGS. 12, 14, and 16 are based on K X-ray. As shown in FIGS. 12, 14, and 16, it was found that potassium was present more in the grain boundaries, and sodium was present more in the crystal grains.

Figure 17:
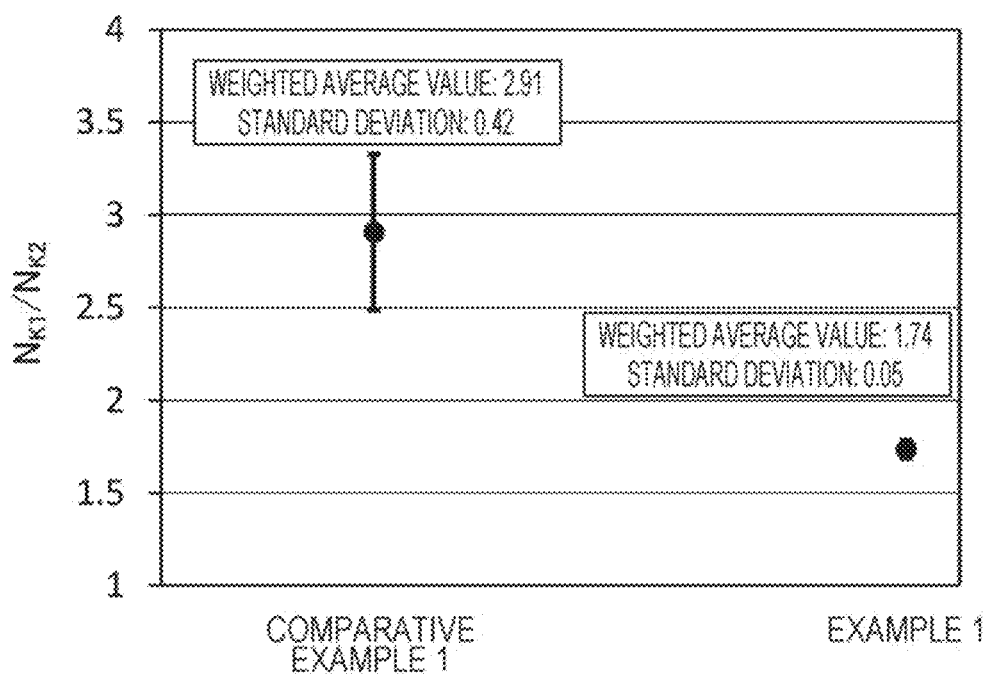
FIG. 17 is a graph showing ratios between atom concentration of potassium contained in grain boundaries and atom concentration of potassium contained in crystal grains of Example 1 and Comparative Example 1.
Figure 18:
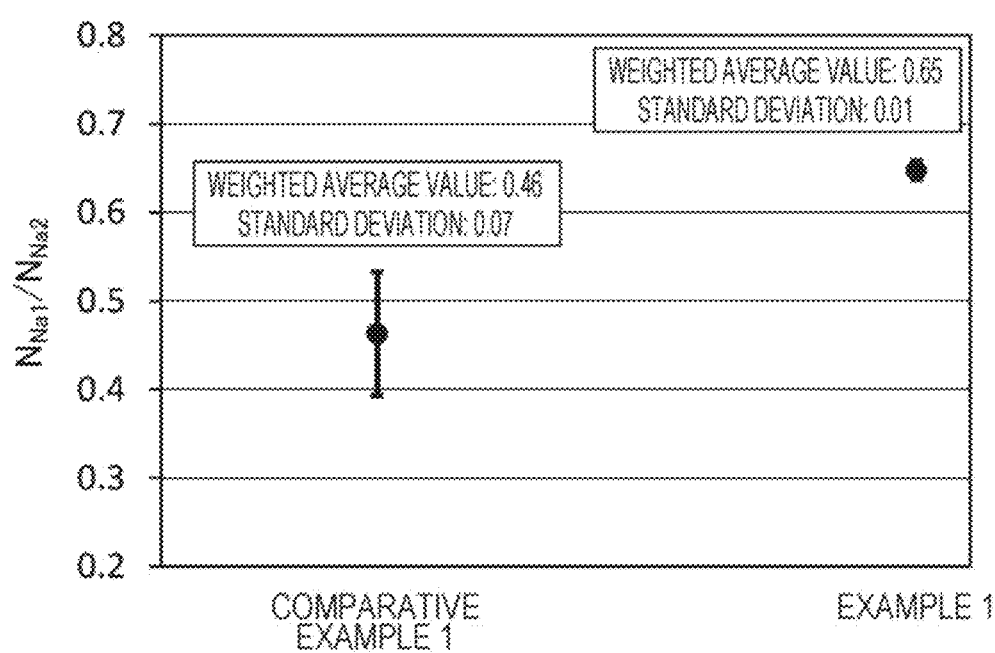
FIG. 18 is a graph showing ratios between atom concentration of sodium contained in the grain boundaries and atom concentration of sodium contained in the crystal grains of Example 1 and Comparative Example 1.
Figure 19:
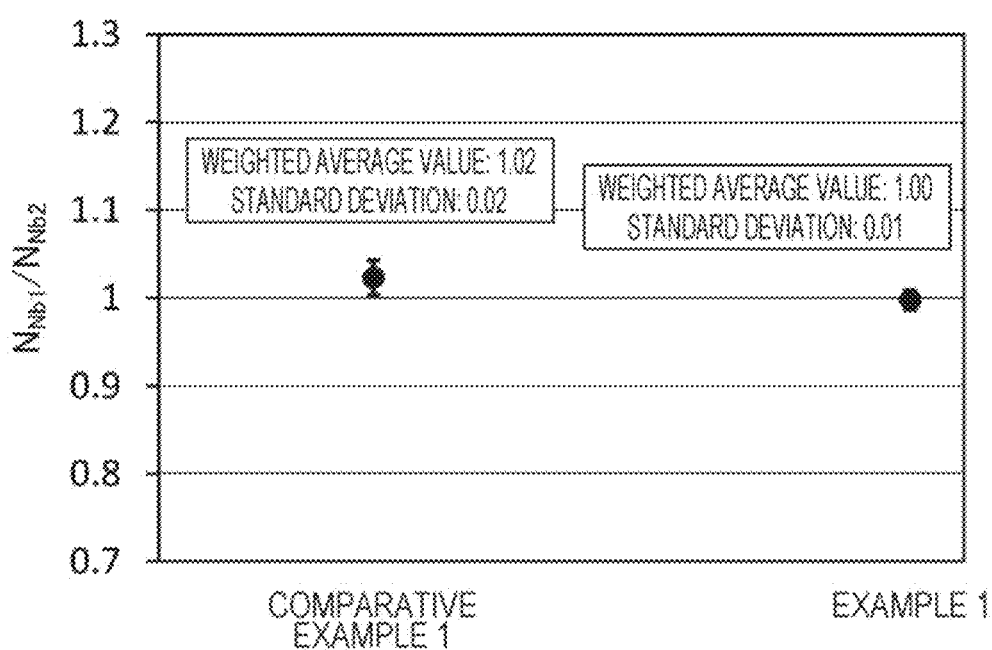
FIG. 19 is a graph showing ratios between atom concentration of niobium contained in the grain boundaries and atom concentration of niobium contained in the crystal grains of Example 1 and Comparative Example 1.

FIG. 17 is a graph showing ratios $N_{K1}/N_{K2}$ between the atom concentration $N_{K1}$ (atm %) of potassium contained in the grain boundaries and the atom concentration $N_{K2}$ (atm %) of potassium contained in the crystal grains of Example 1 and Comparative Example 1. FIG. 18 is a graph showing ratios $N_{Na1}/N_{Na2}$ between the atom concentration $N_{Na1}$ (atm %) of sodium contained in the grain boundaries and the atom concentration $N_{Na2}$ (atm %) of sodium contained in the crystal grains of Example 1 and Comparative Example 1. FIG. 19 is a graph showing ratios $N_{Nb1}/N_{Nb2}$ between the atom concentration $N_{Nb1}$ (atm %) of niobium contained in the grain boundaries and the atom concentration $N_{Nb2}$ (atm %) of niobium contained in the crystal grains of Example 1 and Comparative Example 1.

To be noted, in FIGS. 17 to 19, the atom concentration ratios between atom concentration of atoms contained in the grain boundaries and atom concentration of atoms contained in the crystal grains were obtained as follows for potassium, sodium, and niobium.

Figure 20:
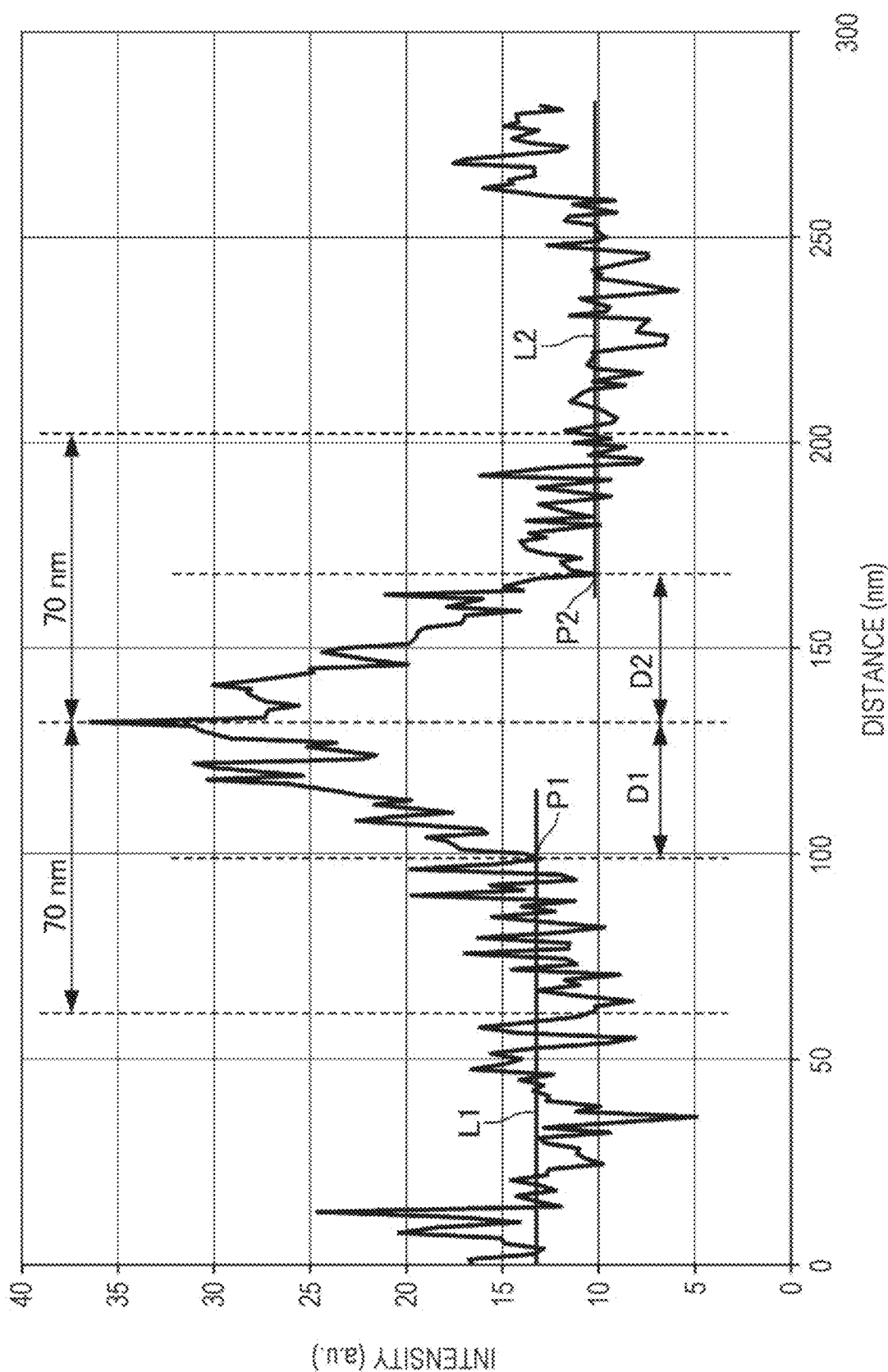
FIG. 20 is a graph showing distribution of potassium in Example 1.

First, for example, grain boundaries were found in the HAADF-STEM image of FIG. 11. Then, in the element mapping by EDX in FIG. 12, a line was drawn with reference to the positions of the grain boundaries found in FIG. 11 so as to cross a grain boundary (for example, a white line shown in the K image of FIG. 12 was drawn), and an intensity distribution of atoms on the line was obtained. That is, as illustrated in FIG. 20, a graph having a horizontal axis indicating distance and a vertical axis indicating intensity obtained by EDX was generated so as to cross the grain boundary. The atom concentration ratios were obtained from this graph. To be noted, FIG. 20 is a graph showing distribution of potassium in Example 1.

In FIG. 17, the distance (position) in which the intensity was the highest in the graph described above was set as a center of the grain boundary, and the intensity thereof was regarded as intensity corresponding to the atom concentration of potassium contained in the grain boundaries. In FIG. 18, the distance (position) in which the intensity was the lowest was set as a center of the grain boundary, and the intensity thereof was regarded as intensity corresponding to the atom concentration of sodium contained in the grain boundaries. In addition, in FIGS. 17 and 18, with reference to the HAADF-STEM image, a region that did not include a grain boundary and was in a distance equal to or longer than 70 nm from centers of grain boundaries was specified, and the intensity of the region was regarded as intensity corresponding to the atom concentration of atoms contained in the crystal grains. Then, the atom concentration ratios were obtained from intensities corresponding to atom concentrations of atoms contained in the grain boundaries and intensities corresponding to atom concentrations of atoms contained in the crystal grains. Further, uncertainty of atom concentration ratio derived from intensity of a region not including a grain boundary was obtained. In FIGS. 17 and 18, by using the atom concentration ratios and uncertainty thereof obtained in this manner and in consideration of propagation of the uncertainty, average values (weighted averages) of the atom concentration ratios are shown as black dots, and the uncertainty (standard deviation) of the average values is shown as error bars.

In FIG. 19, the distance (position) in which the intensity was the highest in the case of potassium was set as a center of a grain boundary, and average values of intensities in a range of ±30 nm from the center was regarded as intensities corresponding to atom concentrations of niobium contained in the grain boundaries. Further, uncertainty of the intensities corresponding to the atom concentrations of niobium contained in the grain boundaries was obtained. Then, similarly to FIGS. 17 and 18, intensities corresponding to the atom concentration of niobium contained in the crystal grains were obtained, and thus the atom concentration ratios were obtained. Further, uncertainty of the atom concentration ratios was obtained from the uncertainty of intensities corresponding to atom concentrations of niobium contained in the grain boundaries and the uncertainty of intensities corresponding to atom concentrations of niobium contained in the crystal grains. In FIG. 19, by using the atom concentration ratios and uncertainty thereof obtained in this manner and in consideration of propagation of the uncertainty, average values (weighted averages) of the atom concentration ratios are shown as black dots, and the uncertainty (standard deviation) of the average values is shown as error bars.

From FIGS. 17 and 18, it was found that the saturation polarization value Pm increased in Example 1 as compared with in Comparative Example 1 because the uniformity of potassium and sodium in the piezoelectric layer was improved by performing the heat treatment by the RTA apparatus after forming the second electrode.

From FIG. 17, it was found that the atom concentration $N_{K1}$ was higher than the atom concentration $N_{K2}$, and the atom concentration $N_{K1}$ and the atom concentration $N_{K2}$ satisfied a relationship of $1.0 < N_{K1}/N_{K2} \leq 2.4$, further satisfied a relationship of $1.5 \leq N_{K1}/N_{K2} \leq 2.0$, and further satisfied a relationship of $1.6 \leq N_{K1}/N_{K2} \leq 1.8$. From FIGS. 10 and 17, it can be said that $N_{K1}/N_{K2}$ and piezoelectric characteristics have a correlation, and good piezoelectric characteristics can be achieved when the relationship of $1.0 < N_{K1}/N_{K2} \leq 2.4$ is satisfied.

From FIG. 18, it was found that the atom concentration $N_{Na1}$ was lower than the atom concentration $N_{Na2}$, and that the atom concentration $N_{Na1}$ and the atom concentration $N_{Na2}$ satisfied a relationship of $0.55 \leq N_{Na1}/N_{Na2} \leq 0.75$, and further satisfied a relationship of $0.60 \leq N_{Na1}/N_{Na2} \leq 0.70$.

From FIG. 19, it was found that the atom concentration $N_{Nb1}$ was approximately equal to the atom concentration $N_{Nb2}$.

Figure 21:
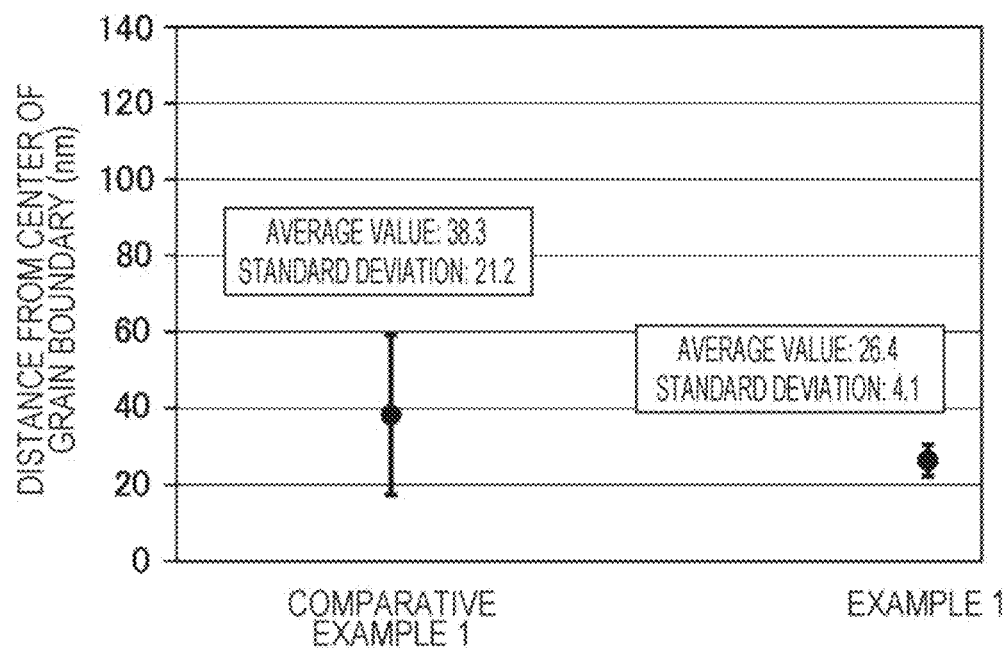
FIG. 21 is a graph showing distribution of potassium in Example 1 and Comparative Example 1.

FIG. 21 is a graph showing distribution of potassium in Example 1 and Comparative Example 1. FIG. 21 is drawn on the basis of FIG. 20.

In FIG. 20, the distance (position) with the highest intensity was set as a center of a grain boundary. In FIG. 20, an intersection point P1 that is the closest to the center of the grain boundary among intersection points of a straight line L1 parallel to the horizontal axis and derived from an average value of a left region (region whose value on the horizontal axis is smaller than the center of the grain boundary) in a distance equal to or longer than 70 nm from the center of the grain boundary and a profile of intensity of FIG. 20 was obtained. In addition, an intersection point P2 that is the closest to the center of the grain boundary among intersection points of a straight line L2 parallel to the horizontal axis and derived from an average value of a right region (region whose value on the horizontal axis is larger than the center of the grain boundary) in a distance equal to or longer than 70 nm from the center of the grain boundary and the profile of intensity of FIG. 20 was obtained. An average value of a distance D1 between the intersection point P1 and the center of the grain boundary and a distance D2 between the intersection point P2 and the center of the grain boundary was obtained. The measurement described above was performed a plurality of times. In FIG. 21, average values of measured values are shown as black dots, and variation (standard deviation) thereof is shown as error bars.

From FIG. 21, it was found that an atom concentration (atm %) of potassium at centers of grain boundaries was higher than an atom concentration (atm %) of potassium in a region in a distance equal to or longer than 70 nm from the centers of the grain boundaries.

Figure 22:
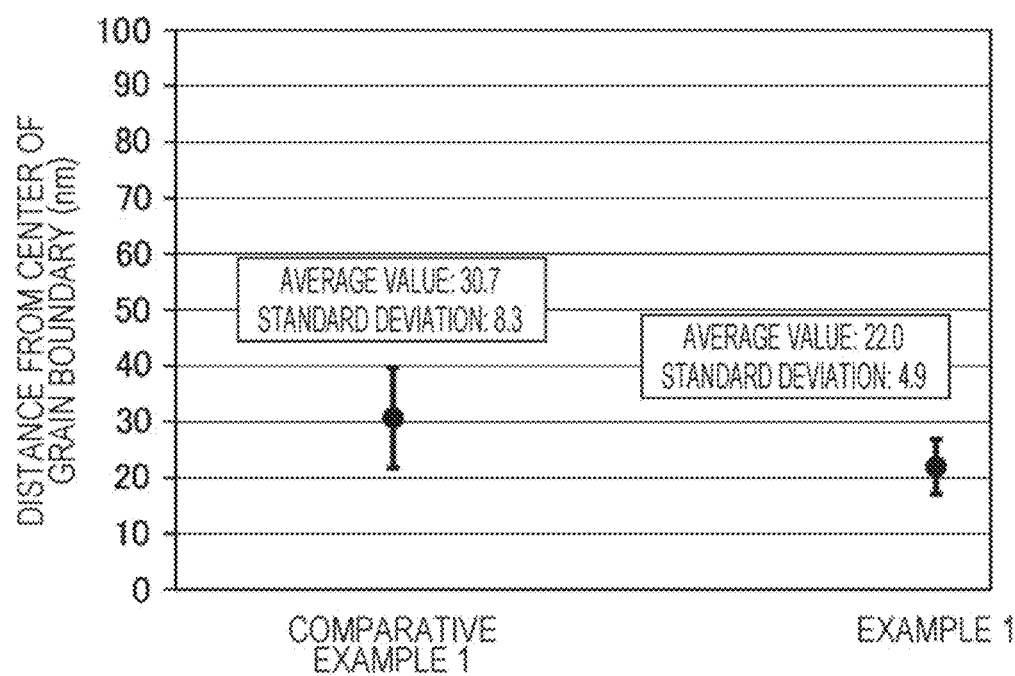
FIG. 22 is a graph showing distribution of sodium in Example 1 and Comparative Example 1.

FIG. 22 is a graph showing distribution of sodium in Example 1 and Comparative Example 1.

FIG. 22 was generated in the same manner as FIG. 21 except that the distance (position) with the lowest intensity was regarded as a center of a grain boundary.

From FIG. 22, it was found that an atom concentration (atm %) of sodium at centers of grain boundaries was higher than an atom concentration (atm %) of sodium in a region in a distance equal to or longer than 70 nm from the centers of the grain boundaries.

Figure 23:
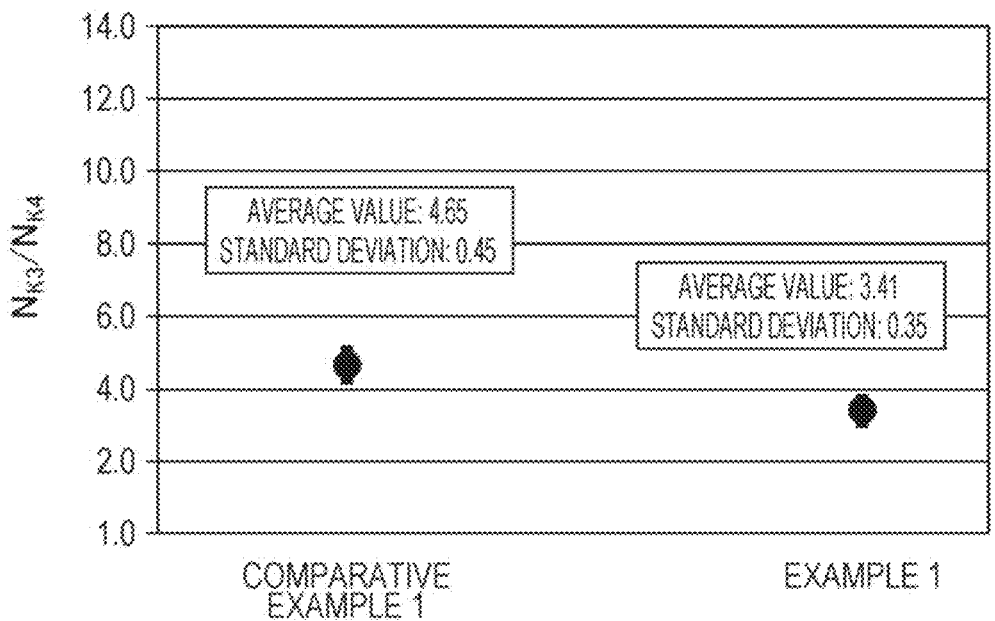
FIG. 23 is a graph showing ratios between atom concentration of potassium contained on the second electrode side and atom concentration of potassium contained on the first electrode side of Example 1 and Comparative Example 1.
Figure 24:
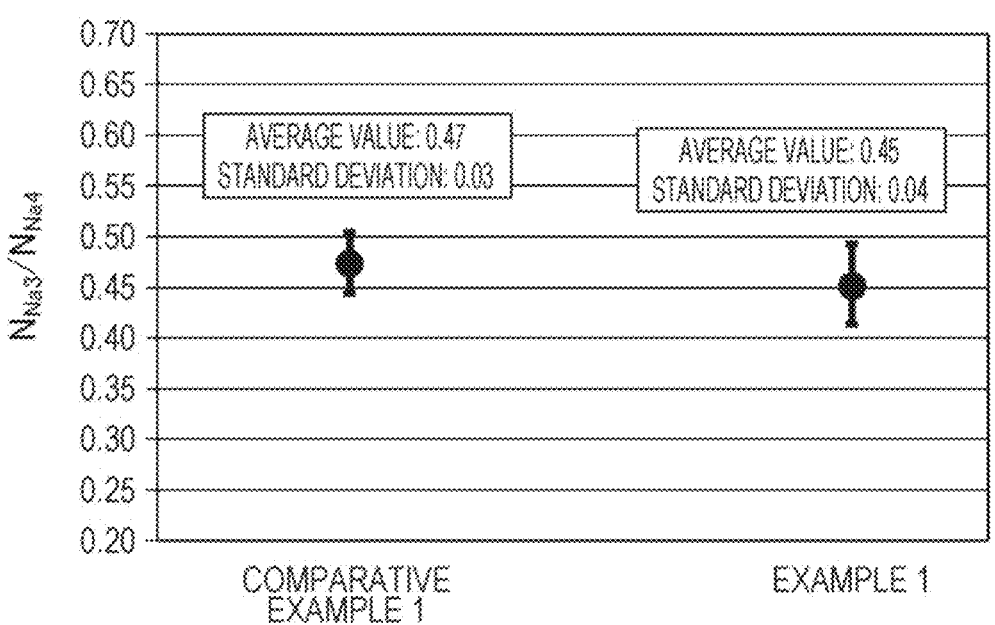
FIG. 24 is a graph showing ratios between atom concentration of sodium contained on the second electrode side and atom concentration of sodium contained on the first electrode side of Example 1 and Comparative Example 1.
Figure 25:
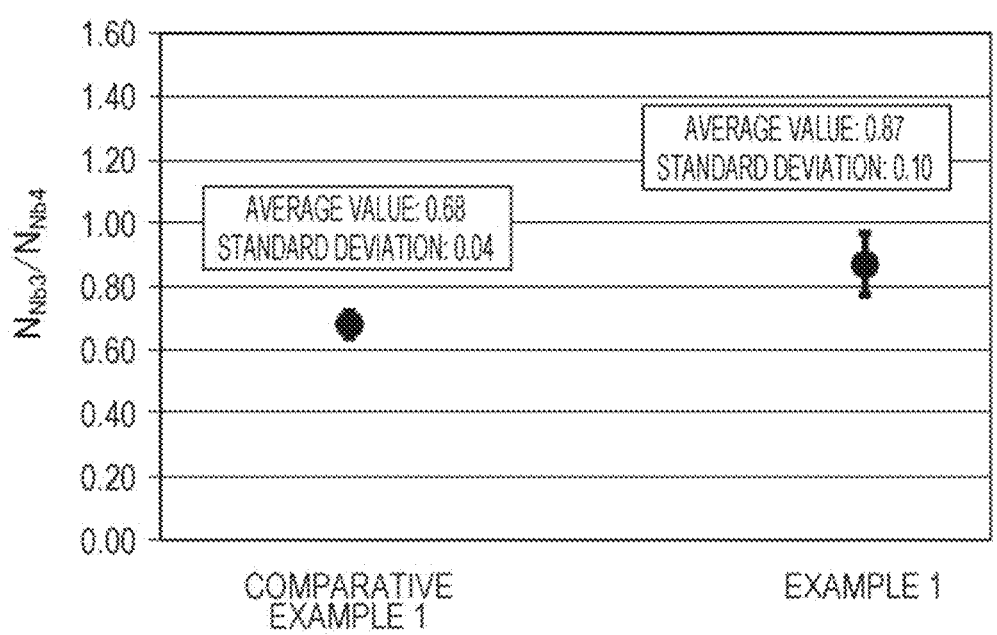
FIG. 25 is a graph showing ratios between atom concentration of niobium contained on the second electrode side and atom concentration of niobium contained on the first electrode side of Example 1 and Comparative Example 1.

FIG. 23 is a graph showing ratios $N_{K3}/N_{K4}$ between the atom concentration $N_{K3}$ (atm %) of potassium contained on the second electrode side of each of the crystal grain-containing layers and the atom concentration $N_{K4}$ (atm %) of potassium contained on the first electrode side of each of the crystal grain-containing layers of Example 1 and Comparative Example 1. FIG. 24 is a graph showing ratios $N_{Na3}/N_{Na4}$ between the atom concentration $N_{Na3}$ (atm %) of sodium contained on the second electrode side of each of the crystal grain-containing layers and the atom concentration $N_{Na4}$ (atm %) of sodium contained on the first electrode side of each of the crystal grain-containing layers of Example 1 and Comparative Example 1. FIG. 25 is a graph showing ratios $N_{Nb3}/N_{Nb4}$ between the atom concentration $N_{Nb3}$ (atm %) of niobium contained on the second electrode side of each of the crystal grain-containing layers and the atom concentration $N_{Nb4}$ (atm %) of niobium contained on the first electrode side of each of the crystal grain-containing layers of Example 1 and Comparative Example 1.

To be noted, in FIGS. 23 to 25, in consideration of concentration gradient of each atom in the crystal grain-containing layers, the atom concentration ratios were obtained by respectively using the maximum value or the minimum value of the intensity of EDX on the first electrode side and the second electrode side. For example in the case where the intensity was higher on the second electrode side, the maximum intensity on the second electrode side was regarded as the intensity corresponding to the atom concentration of atoms on the second electrode side, the minimum intensity on the first electrode side was regarded as the intensity corresponding to the atom concentration of atoms on the first electrode side, and a ratio between these intensities was used as the atom concentration ratio. The measurement described above was performed a plurality of times. In FIGS. 23 to 25, average values of the measured values are shown as black dots, and variation (standard deviation) thereof is shown as error bars.

From FIG. 23, it was found that the atom concentration $N_{K3}$ was higher than the atom concentration $N_{K4}$, and the atom concentration $N_{K3}$ and the atom concentration $N_{K4}$ satisfied a relationship of $2.0 \leq N_{K3}/N_{K4} \leq 4.0$, and further satisfied a relationship of $3.0 \leq N_{K3}/N_{K4} \leq 3.8$.

From FIG. 24, it was found that the atom concentration $N_{Na3}$ was lower than the atom concentration $N_{Na4}$, and that the atom concentration $N_{Na3}$ and the atom concentration $N_{Na4}$ satisfied a relationship of $0.40 \leq N_{Na3}/N_{Na4} \leq 0.50$.

From FIG. 25, it was found that the atom concentration $N_{Nb3}$ was lower than the atom concentration $N_{Nb4}$, and that the atom concentration $N_{Nb3}$ and the atom concentration $N_{Nb4}$ satisfied a relationship of $0.70 \leq N_{Nb3}/N_{Nb4} < 1.00$.

Elements of the invention can be partially omitted, and the embodiments and modification examples may be combined as long as the features and effects described in the present disclosure are achieved.

The invention includes configurations that are substantially the same as the configuration described in the embodiment (for example, configurations having the same functions, using the same methods, and having the same results, or configurations having the same object and the same effect). In addition, the invention includes configurations in which a portion that is not significant in the configuration described in the embodiment is replaced. In addition, the invention includes configurations that have the same effect as the configuration described in the embodiment and configurations that achieve the same object. In addition, the invention includes configurations in which a known technique is added to the configuration described in the embodiment.

What is claimed is:

1. A piezoelectric element comprising:
   a first electrode provided above a substrate;
   a piezoelectric layer including a plurality of crystal grains containing potassium, sodium, and niobium and provided above the first electrode; and
   a second electrode provided above the piezoelectric layer,
      wherein an atom concentration $N_{K1}$ (atm %) of potassium contained in grain boundaries of the crystal grains and an atom concentration $N_{K2}$ (atm %) of potassium contained in the crystal grains satisfy a relationship of $1.0 < N_{K1}/N_{K2} \leq 2.4$.

2. The piezoelectric element according to claim 1, wherein an atom concentration $N_{Na1}$ (atm %) of sodium contained in the grain boundaries is lower than an atom concentration $N_{Na2}$ (atm %) of sodium contained in the crystal grains.

3. The piezoelectric element according to claim 2, wherein the atom concentration $N_{Na1}$ and the atom concentration $N_{Na2}$ satisfy a relationship of $0.55 \leq N_{Na1}/N_{Na2} \leq 0.75$.

4. The piezoelectric element according to claim 1, wherein the atom concentration $N_{K1}$ and the atom concentration $N_{K2}$ satisfy a relationship of $1.5 \leq N_{K1}/N_{K2} \leq 2.0$.

5. The piezoelectric element according to claim 1,
   wherein the piezoelectric layer includes a plurality of layers containing the crystal grains laminated in a film thickness direction, and
   wherein an atom concentration $N_{K3}$ (atm %) of potassium on the second electrode side of each of the layers containing the crystal grains is higher than an atom concentration $N_{K4}$ (atm %) of potassium on the first electrode side of each of the layers containing the crystal grains.

6. The piezoelectric element according to claim 5, wherein the atom concentration $N_{K3}$ and the atom concentration $N_{K4}$ satisfy a relationship of $2.0 \leq N_{K3}/N_{K4} \leq 4.0$.

7. The piezoelectric element according to claim 5, wherein an atom concentration (atm %) of sodium contained on the second electrode side of each of the layers containing the crystal grains is lower than an atom concentration (atm %) of sodium contained on the first electrode side of each of the layers containing the crystal grains.

8. The piezoelectric element according to claim 1, wherein an atom concentration (atm %) of potassium at centers of the grain boundaries is higher than an atom concentration (atm %) of potassium in a region in a distance equal to or longer than 70 nm from the centers of the grain boundaries.

9. The piezoelectric element according to claim 1, wherein an atom concentration (atm %) of sodium at centers of the grain boundaries is lower than an atom concentration (atm %) of sodium in a region in a distance equal to or longer than 70 nm from the centers of the grain boundaries.

10. A liquid ejecting head comprising the piezoelectric element according to claim 1.

11. A liquid ejecting head comprising the piezoelectric element according to claim 2.

12. A liquid ejecting head comprising the piezoelectric element according to claim 3.

13. A liquid ejecting head comprising the piezoelectric element according to claim 4.

14. A liquid ejecting head comprising the piezoelectric element according to claim 5.

15. A liquid ejecting head comprising the piezoelectric element according to claim 6.

16. A liquid ejecting head comprising the piezoelectric element according to claim 7.

17. A liquid ejecting head comprising the piezoelectric element according to claim 8.

18. A liquid ejecting head comprising the piezoelectric element according to claim 9.

* * * * *